United States Patent
Cheng et al.

(10) Patent No.: US 10,508,023 B2
(45) Date of Patent: *Dec. 17, 2019

(54) MEMS DEVICES INCLUDING MEMS DIES AND CONNECTORS THERETO

(71) Applicant: Taiwan Semiconductor Manufacturing Company, Ltd., Hsinchu (TW)

(72) Inventors: Chun-Wen Cheng, Zhubei (TW); Jung-Huei Peng, Jhubei (TW); Shang-Ying Tsai, Pingzhen (TW); Hung-Chia Tsai, Taichung (TW); Yi-Chuan Teng, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/910,628

(22) Filed: Mar. 2, 2018

(65) Prior Publication Data

US 2018/0194613 A1    Jul. 12, 2018

Related U.S. Application Data

(62) Division of application No. 15/160,884, filed on May 20, 2016, now Pat. No. 9,919,914, which is a division
(Continued)

(51) Int. Cl.
*B81B 7/00* (2006.01)
*B81C 1/00* (2006.01)
(Continued)

(52) U.S. Cl.
CPC .............. *B81B 7/0006* (2013.01); *B81B 7/02* (2013.01); *B81C 1/0023* (2013.01);
(Continued)

(58) Field of Classification Search
None
See application file for complete search history.

(56) References Cited

U.S. PATENT DOCUMENTS 8,035,209 B2    10/2011   Gonska et al.
8,154,115 B1 *   4/2012   Chan ....................... B81B 7/007
                                                           257/704
(Continued)

*Primary Examiner* — Andres Munoz
(74) *Attorney, Agent, or Firm* — Slater Matsil, LLP

(57) ABSTRACT

An embodiment is MEMS device including a first MEMS die having a first cavity at a first pressure, a second MEMS die having a second cavity at a second pressure, the second pressure being different from the first pressure, and a molding material surrounding the first MEMS die and the second MEMS die, the molding material having a first surface over the first and the second MEMS dies. The device further includes a first set of electrical connectors in the molding material, each of the first set of electrical connectors coupling at least one of the first and the second MEMS dies to the first surface of the molding material, and a second set of electrical connectors over the first surface of the molding material, each of the second set of electrical connectors being coupled to at least one of the first set of electrical connectors.

20 Claims, 22 Drawing Sheets

Related U.S. Application Data of application No. 14/157,273, filed on Jan. 16, 2014, now Pat. No. 9,352,956.

(51) Int. Cl.
    *B81B 7/02*         (2006.01)
    *H01L 21/78*      (2006.01)
    *H01L 23/053*     (2006.01)
    *H01L 23/31*      (2006.01)

(52) U.S. Cl.
CPC .............. *B81B 2201/0235* (2013.01); *B81B 2201/0242* (2013.01); *B81B 2201/0264* (2013.01); *B81B 2203/0315* (2013.01); *B81B 2207/098* (2013.01); *B81C 2203/0154* (2013.01); *B81C 2203/0714* (2013.01); *H01L 21/78* (2013.01); *H01L 23/053* (2013.01); *H01L 23/31* (2013.01); *H01L 2924/16152* (2013.01); *H01L 2924/16235* (2013.01)

(56) References Cited

U.S. PATENT DOCUMENTS

| | | | |
|---|---|---|---|
| 8,286,854 B2 | 10/2012 | Rettig et al. | |
| 8,438,718 B2 | 5/2013 | Aono et al. | |
| 8,941,152 B1 | 1/2015 | Cheng et al. | |
| 8,952,465 B2 | 2/2015 | Liang et al. | |
| 8,987,059 B2 | 3/2015 | Liang et al. | |
| 9,023,675 B2 | 5/2015 | Nicolas | |
| 9,029,961 B2 | 5/2015 | Chang et al. | |
| 9,040,334 B2 | 5/2015 | Chu et al. | |
| 9,065,358 B2 | 6/2015 | Tsai et al. | |
| 9,085,455 B2 | 7/2015 | Cheng et al. | |
| 9,085,456 B2 | 7/2015 | Tsai et al. | |
| 9,122,827 B2 | 9/2015 | Chen et al. | |
| 9,133,017 B2 | 9/2015 | Liang et al. | |
| 9,133,021 B2 | 9/2015 | Chang et al. | |
| 9,138,994 B2 | 9/2015 | Peng et al. | |
| 9,139,420 B2 | 9/2015 | Chang et al. | |
| 9,139,423 B2 | 9/2015 | Chien et al. | |
| 9,139,424 B2 | 9/2015 | Nicolas et al. | |
| 9,181,083 B2 | 11/2015 | Tsai et al. | |
| 9,187,317 B2 | 11/2015 | Cheng et al. | |
| 9,233,839 B2 | 1/2016 | Liu et al. | |
| 9,236,877 B2 | 1/2016 | Peng et al. | |
| 9,238,581 B2 | 1/2016 | Wu et al. | |
| 9,919,914 B2 * | 3/2018 | Cheng | B81B 7/0006 |
| 2006/0144142 A1 | 7/2006 | Gogoi | |
| 2008/0185699 A1 * | 8/2008 | Wang | B81C 1/00269 257/676 |
| 2011/0177643 A1 | 7/2011 | Chiu et al. | |
| 2012/0292722 A1 | 11/2012 | Lin et al. | |
| 2013/0017643 A1 | 1/2013 | Lin et al. | |
| 2013/0264684 A1 | 10/2013 | Yu et al. | |
| 2014/0227816 A1 | 8/2014 | Zhang et al. | |
| 2014/0287548 A1 | 9/2014 | Lin et al. | |
| 2015/0137303 A1 | 5/2015 | Chou et al. | |
| 2015/0166329 A1 | 6/2015 | Gheng et al. | |
| 2015/0175405 A1 | 6/2015 | Cheng | |
| 2015/0175407 A1 | 6/2015 | Cheng et al. | |
| 2015/0196912 A1 | 7/2015 | Tsai et al. | |
| 2015/0291415 A1 * | 10/2015 | Haney | B81C 1/00539 257/414 |

* cited by examiner

MEMS DEVICES INCLUDING MEMS DIES AND CONNECTORS THERETO

This application is a divisional of U.S. patent application Ser. No. 15/160,884, filed May 20, 2016, which is a divisional of U.S. patent application Ser. No. 14/157,273, filed Jan. 16, 2014, now U.S. Pat. No. 9,352,956, issued on May 31, 2016, entitled "MEMS Devices and Methods for Forming Same." These applications are hereby incorporated herein by reference.

BACKGROUND

Microelectromechanical systems ("MEMS") are becoming increasingly popular, particularly as such devices are miniaturized and are integrated into integrated circuit manufacturing processes. MEMS devices introduce their own unique requirements into the integration process, however. Electrically interconnecting MEMS devices is an area of unique challenges. In particular, integrating MEMS pressure sensor devices, MEMS motion sensor devices, and MEMS gyroscope sensor devices into the same integrated circuit manufacturing process has posed challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
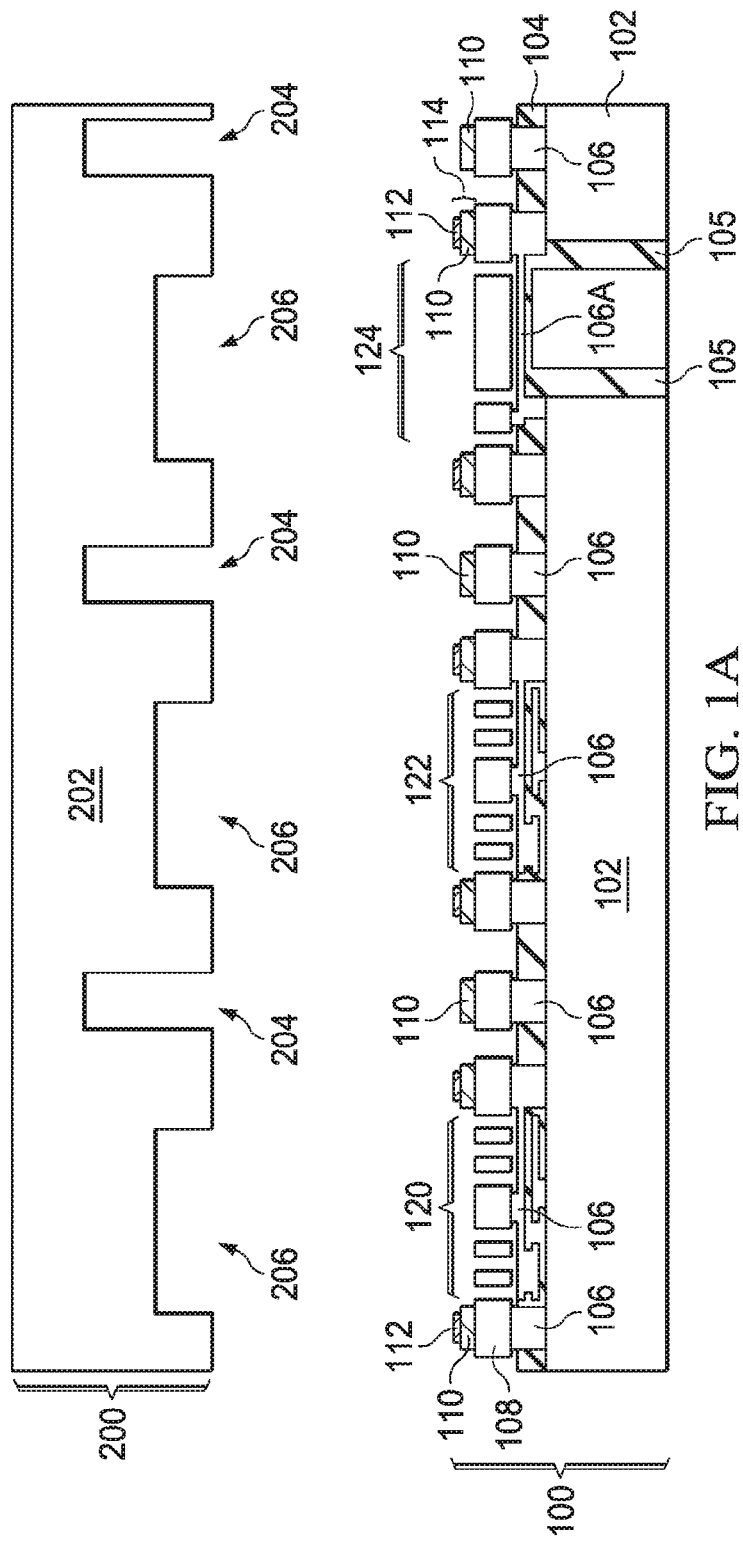
FIGS. 1A through 1H illustrate cross-sectional views of intermediate stages of manufacture of a MEMS device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely a MEMS device that can integrate at least two known good dies of an application-specific integrated circuit (ASIC) die, a high pressure die, a high vacuum (low pressure) die, and a pressure sensor die. Other embodiments may also be applied, however, to other MEMS devices having known good dies side-by-side or stacked.

FIGS. 1A through 1H illustrate cross-sectional views of intermediate stages of manufacture of a MEMS device die 550 in accordance with some embodiments. With reference now to FIG. 1, there is illustrated a MEMS wafer 100. The MEMS wafer 100 includes a substrate 102 and a dielectric layer 104 on a surface of the substrate 102. The substrate 102 may be formed of silicon, silicon germanium, silicon carbide or the like. The substrate 102 may be formed of low resistive silicon. Alternatively, the substrate 102 may be a silicon-on-insulator (SOI) substrate. The SOI substrate may comprise a layer of a semiconductor material (e.g., silicon, germanium and the like) formed over an insulator layer (e.g., buried oxide and the like), which is formed in a silicon substrate. In addition, other substrates that may be used include multi-layered substrates, gradient substrates, hybrid orientation substrates, the like, or a combination thereof.

The dielectric layer 104 is formed on a top surface of the substrate 102. The dielectric layer 104 may comprise one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. The dielectric layer 104 may be deposited over substrate 102 using, for example, spinning, chemical vapor disposition (CVD), plasma enhanced chemical vapor deposition (PECVD), low pressure CVD (LP-CVD), the like, or a combination thereof. In some embodiments, the dielectric layer 104 may be a release layer and released (i.e., removed) in subsequent process steps in order to form MEMS structures; therefore, dielectric layer 104 may also be referred to as sacrificial (SAC) dielectric layer 104.

One or more polysilicon layers 106 may be formed throughout the dielectric layer 104. For example, portions of the polysilicon layer 106 may be used as electrical routing, some portions of the polysilicon layer 106 may act as mechanical structure, or some portions of the polysilicon layer 106 may act as mechanical bumps to limit the motion of moving elements in MEMS wafer 100, or as anti-stiction bumps. In some embodiments, portions of the polysilicon layer 106 may be used as a vapor hydrogen-fluoride (vapor HF) etch stop layer in subsequent process steps. In other embodiments, the layer 114 may be formed of a different material in lieu of polysilicon such as SiGe, single crystal silicon (e.g., by using a silicon-on-insulator wafer as a starting material), or the like.

A MEMS layer 108 is formed over the polysilicon layer 106 and the dielectric layer 104. In some embodiments, the MEMS layer 108 is a wafer 108 that is attached to the polysilicon layer 106 as illustrated in FIG. 1. The wafer 108 may then be patterned to the form the MEMS structures 120, 122, and 124 in wafer 108. In some embodiments, the MEMS layer 108 is formed over the polysilicon layer 106 and the dielectric layer 104 by a suitable deposition process such as CVD, atomic layer deposition (ALD), epitaxial growth, or the like. In this embodiment, a mask layer (not shown) may be formed over the polysilicon layer 106 and the dielectric layer 104 and the MEMS layer 108 may be formed in openings of the mask layer. In some embodiments, the MEMS layer 108 may be a substrate that is substantially similar to the substrate 102.

The substrate 102 includes openings extending through the substrate 102 that are filled with a dielectric material 105. This dielectric material 105 is a release layer that is released (i.e., removed) in subsequent process steps in order to expose a region 106A of the polysilicon layer 106 to an ambient pressure and form a pressure sensor. The region 106A of polysilicon layer 106 may act as a membrane of the pressure sensor device in a completed MEMS device die 406 (see FIG. 1H). In the completed MEMS device die 406, openings 158 and cavity 220 expose this region 106A of polysilicon layer 106 to ambient pressure and the cavity 218 exposes this region 106A of polysilicon layer 106 to a sealed pressure. The dielectric material 105 may be formed of the same materials and by the same processes as the dielectric layer 104 described above and the description is not repeated herein.

In some embodiments, the MEMS structure 120 is an accelerometer, the MEMS structure 122 is a gyroscope, and the MEMS structure 124 is a pressure sensor. In other embodiments, the MEMS structures 120 and 122 may be motion sensors, resonators, or the like. In the illustrated embodiment, the MEMS structures 120, 122, and 124 are formed from the same MEMS wafer 100. However, in other embodiments, the different MEMS structures and/or device dies (see 402, 404, and 406 in FIG. 1C) can be formed from different wafers and different processes and later integrated together during the molding process (see FIG. 1E).

Bonding material layers 114 (alternatively referred to as bonds 114) are formed over a surface of the MEMS layer 108. The bonding material layers 114 may comprise multiple layers 110 and 112 and may be used for eutectic bonding in subsequent process steps to form cavities between a cap wafer 200 and the MEMS wafer 100. The bonding material layers 114 may be blanket deposited and patterned using for example physical vapor deposition (PVD) and photolithography/etching. The bonding material layers 110 may comprise a layer of aluminum copper under a bonding material layer 112 comprising germanium although other metallic materials such as gold may also be used. As illustrated in FIG. 1A, some of the layers 110 do not have a layer 112 over them, as these layers 110 will be used to form electrical connectors on to provide electrical connection to adjacent MEMS structure. The bonding material layers 114 may or may not be electrically connected to the polysilicon layer 106.

FIG. 1A also illustrates the cap wafer 200 over the MEMS wafer 100. The cap wafer 200 may or may not be a complementary metal-oxide-semiconductor (CMOS) wafer, which may or may not have electrical circuits (not shown). In particular, the cap wafer 200 may include various active devices such as transistors, capacitors, resistors, diodes, photodiodes, fuses, and the like. The electrical circuits may be interconnected to perform one or more functions suitable for a particular application, which may or may not be related to the MEMS structures 120, 122, and 124. FIG. 1A illustrates the cap wafer 200 as having a substrate 202 and cavities 204 and 206 formed in the substrate 202. However, in some embodiments, the cap wafer 200 may also include dielectric layers, conductive lines and vias for electrical routing. The substrate 202 may be a substrate that is substantially similar to the substrate 102 and the description is not repeated herein.

The cavities 206 formed in the cap wafer 200 may function as sealed cavities for a motion sensor, a gyroscope, an accelerometer, and/or a pressure sensor after the cap wafer 200 is bonded to the MEMS wafer 100. The cavities 204 are formed between adjacent cavities 206 and are aligned over the bonding material layers 110 to be used as bond pads for electrical connectors to prevent the cap wafer 200 from being bonded to these bonding material layers 110.

Figure 1B:
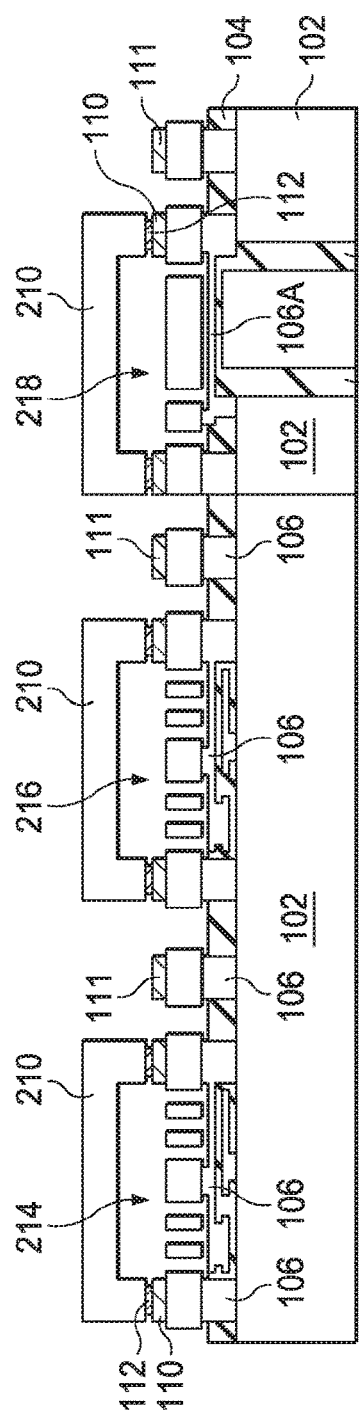

FIG. 1B illustrates the bonding of the cap wafer 200 to the MEMS wafer 100 and grinding the backside of the cap wafer 200 to form caps 210. The cap wafer 200 may be bonded to the MEMS wafer 100 by eutectic bonding between the bonding material layers 112 and 110. The bonding of the cap wafer 200 to the MEMS wafer 100 forms three cavities 214, 216, and 218 between the cap wafer 200 and the polysilicon layer 106. The pressure of the sealed cavities 214, 216, and 218 may be defined by the conditions of the eutectic bonding process between the cap wafer 200 and the MEMS wafer 100. In an embodiment, each of the caps 210 are bonded by separate bonding processes with each of the bonding processes before performed at different pressures. In some embodiments, the cavities 214, 216, and 218 may each have a different pressures, and in other embodiments, they may each have a substantially same pressure. In some embodiments, at least one of the sealed cavities 214, 216, and 218 a low pressure (high vacuum) cavity with a pressure in a range from about 0.1 mbar to about 500 mbar, with at least one of the other of the sealed cavities 214, 216, and 218 being a high pressure cavity with a pressure in a range from about 2.5 atmospheres (ATM) to about 3.5 ATM. In an embodiment, at least one of the cavities 214, 216, and 218 has a pressure from about 0.1 mbar to about 500 mbar.

The cap wafer 200 is thinned until a desired thickness is achieved and the backsides of the cavities 204 (see FIG. 1A) are exposed to form the separate caps 210 over the cavities 214, 216, and 218. The thinning process also exposes the bonding material layers 110 aligned with the cavities 204 (see FIG. 1A). These exposed bonding material layers 110 will be used as bond pads for subsequently formed electrical connectors 130 (see FIG. 1D) and will be referred to as bond pads 111 hereinafter. The thinning process may be implemented by using suitable techniques such as grinding, polishing, chemical etching, the like, or a combination thereof. For example, a chemical mechanical polishing (CMP) process may be used to thin the cap wafer 200.

Figure 1C:
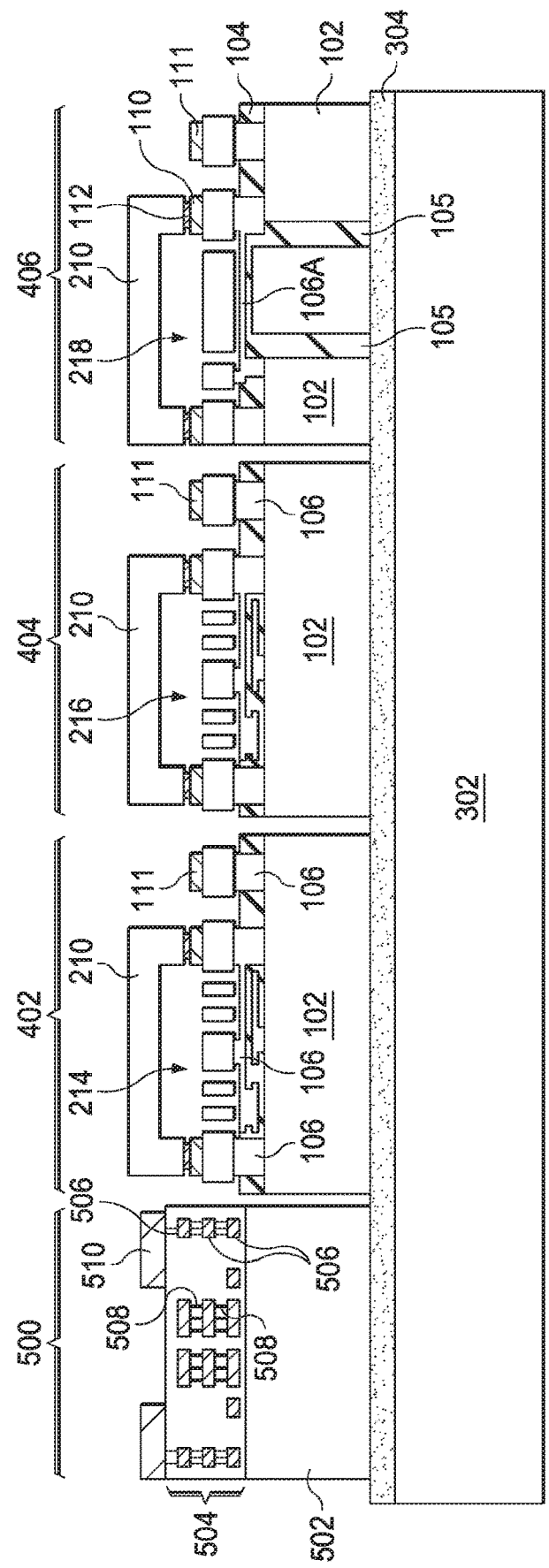

FIG. 1C illustrates the singulation of the MEMS wafer 100 to form separate MEMS device dies 402, 404, and 406. These separate MEMS device dies 402, 404, and 406 are then attached to a carrier 302 with an adhesive layer 304 with a CMOS die 500 also attached to the carrier 302 with the adhesive layer 304. The CMOS die 500 and the MEMS device dies 402, 404, and 406 may be placed on the adhesive layer 304, for example, by a pick-and-place tool. The MEMS wafer 100 may be singulated by a sawing process using a die saw, a laser, or the like. In some embodiments, MEMS devices 402, 404, and 406 are tested before singulation, and, in other embodiments, they are tested after singulation. The types of testing performed depend on the design and/or purpose of the MEMS device being tested. By testing the MEMS devices before encapsulation (see FIG. 1E), only known good dies are attached to the carrier 302, and thus, the yield for the subsequently formed MEMS device 550 (see FIG. 1H) is improved.

The adhesive layer 304 may be disposed, for example laminated, on the carrier 302. The adhesive layer 304 may be formed of a glue, such as an ultra-violet (UV) glue, or may be a lamination layer formed of a foil. The carrier 302 may be any suitable substrate that provides (during intermediary operations of the fabrication process) mechanical support for the MEMS device dies, the CMOS die, and other structures on top of the carrier 302. The carrier 302 may be a wafer including glass, silicon (e.g., a silicon wafer), silicon oxide, metal plate, a ceramic material, or the like.

The CMOS die includes a substrate 502, an interconnect structure 504, and bond pads 510. In an embodiment, the substrate 502 is a part of a wafer. The CMOS die 500 may also be referred to as an ASIC die 500. The substrate 502 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 502 may be a SOI substrate. Generally, an SOI substrate includes a layer of a semiconductor material such as epitaxial silicon, germanium, silicon germanium, SOI, silicon germanium on insulator (SGOI), or combinations thereof.

The substrate 502 may include active and passive devices (not shown in FIG. 1C). As one of ordinary skill in the art will recognize, a wide variety of devices such as transistors, capacitors, resistors, combinations of these, and the like may be used to generate the structural and functional requirements of the design for CMOS die 500. The devices may be formed using any suitable methods.

The interconnect structure 504 is formed over the substrate 502. The interconnect structure 504 includes one or more metallization layers 506 which are interconnected by vias 508. The metallization layers 506 may be formed over the active and passive devices and are designed to connect the various devices to form functional circuitry. The metallization layers 506 may be formed of alternating layers of dielectric (e.g., low-k dielectric material) and conductive material (e.g., copper) and may be formed through any suitable process (such as deposition, damascene, dual damascene, or the like). Although FIG. 1C only illustrates four metallization layer 506, it is within the contemplated scope of the present disclosure that there may be more or less metallization layers 506 included in the interconnect structure 504.

The bond pads 510 may be formed over and in electrical contact with the interconnect structure 504 in order to help provide external connections to the active and passive devices. The bond pad 510 may be made of aluminum, an aluminum alloy, copper, a copper alloy, nickel, the like, or a combination thereof. The bond pads 510 may be formed using a deposition process, such as sputtering, to form a layer of material (not shown). Portions of the layer of material may then be removed through a suitable process, such as photolithographic masking and etching, to form the bond pads 510. However, any other suitable process may be utilized to form bond pads 510.

Figure 1D:
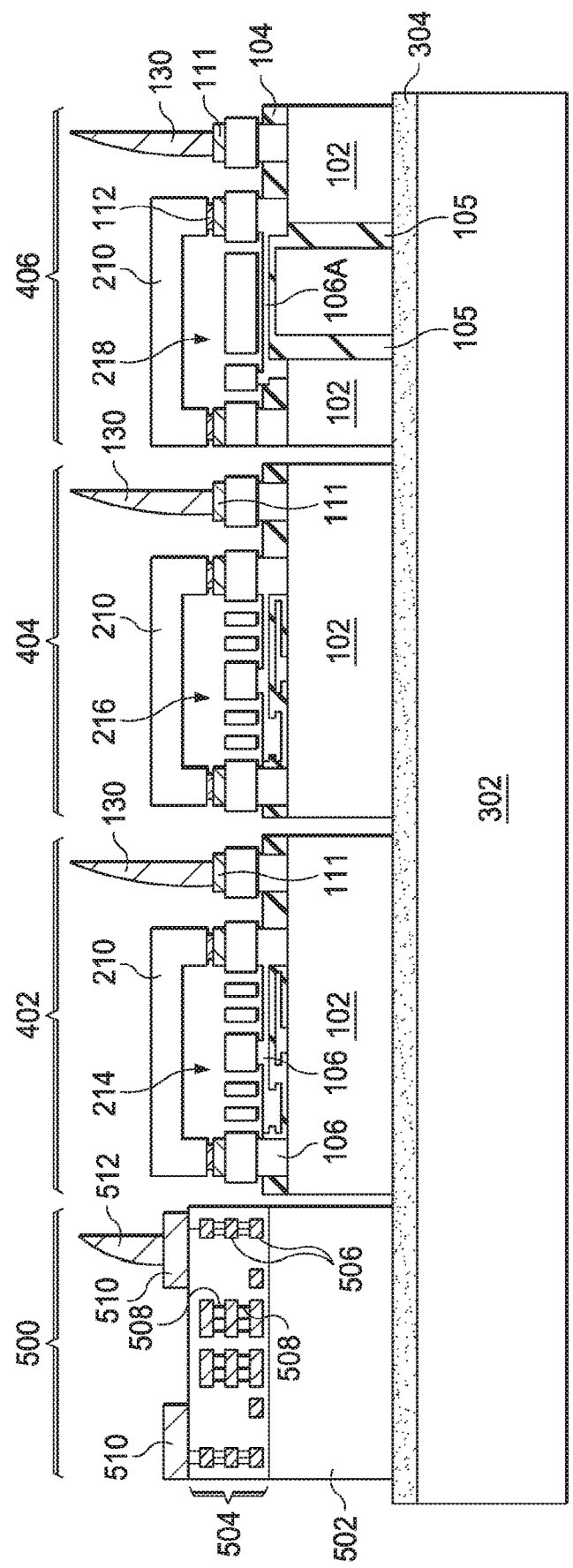

FIG. 1D illustrates forming an electrical connector 512 on at least one bond pad 510 and the electrical connectors 130 on the bond pads 111. The electrical connectors 512 and 130 may be stud bumps, which are formed by wire bonding on the bond pads 510 and 111, and cutting the bond wire with a portion of bond wire left attached to the respective bond ball. For example, in FIG. 1D, the electrical connectors 512 and 130 include a lower portion and an upper portion, wherein the lower portion may be a bond ball formed in the wire bonding, and the upper portion may be the remaining bond wire. The upper portion of the electrical connectors 512 and 130 may have a uniform width and a uniform shape that are uniform throughout the top part, the middle part, and the bottom part of upper portion. The electrical connectors 512 and 130 are formed of non-solder metallic materials that do not melt at the normal temperatures (for example, between about 220° C. and about 280° C.) that are used to reflow solder. In some exemplary embodiments, the electrical connectors 512 and 130 are made of copper, aluminum, nickel, gold, silver, palladium, the like, or a combination thereof, and may have a composite structure including a plurality of layers.

In alternative embodiments, the electrical connectors 512 and 130 are formed through electrical plating. In these embodiments, a sacrificial layer (not shown) is formed over the CMOS die 500 and the MEMS device dies 402, 404, and 406. A plurality of openings is formed in the sacrificial layer to expose the underlying bond pads 510 and 111. A plating step is then performed to plate the electrical connectors 512 and 130. After the formation of the electrical connectors 512 and 130, the sacrificial layer is then removed.

Figure 1E:
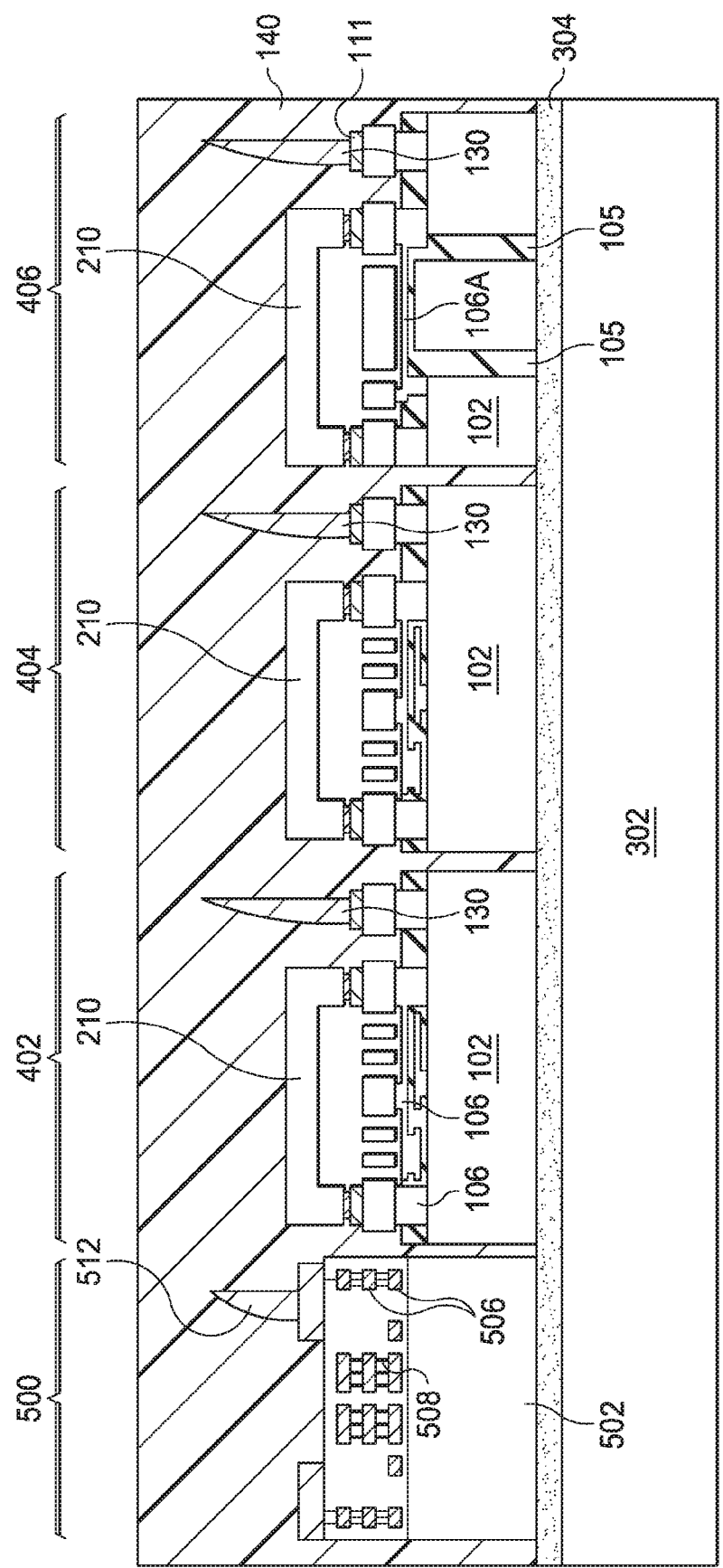

FIG. 1E illustrates encapsulating the CMOS die 500, the MEMS device dies 402, 404, and 406, and the electrical connectors 512 and 130. In some embodiments, the CMOS die 500, the MEMS device dies 402, 404, and 406, and the electrical connectors 512 and 130 are encapsulated by a molding material 140. The molding material 140 may be molded on the CMOS die 500, the MEMS device dies 402, 404, and 406, and the electrical connectors 512 and 130, for example, using compression molding. In some embodiments, the molding material 140 is made of a molding compound, a polymer, an epoxy, the like, or a combination thereof. A curing step may be performed to cure the molding material 140, wherein the curing may be a thermal curing, a UV curing, or the like.

Figure 1F:
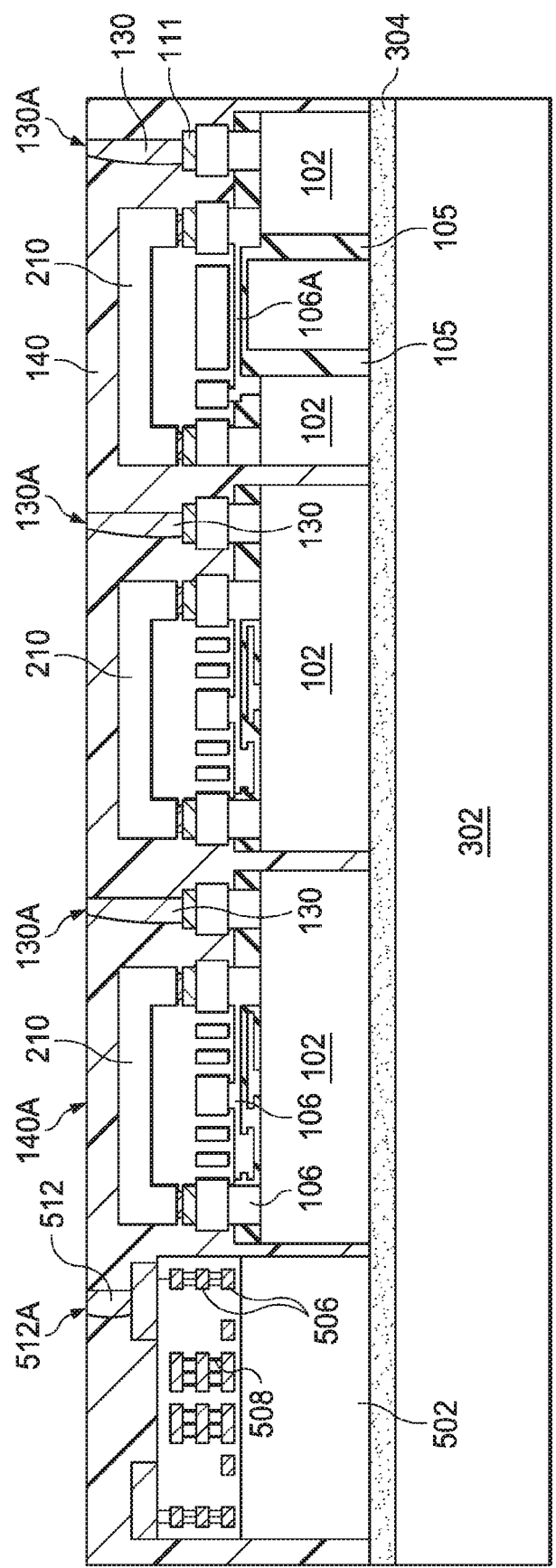

In some embodiments, the CMOS die 500, the MEMS device dies 402, 404, and 406, and the electrical connectors 512 and 130 are buried in the molding material 140, and after the curing of the molding material 140, a planarization step, such as a grinding, is performed to remove excess portions of the molding material 140, which excess portions are over top surfaces of the electrical connectors 512 and 130 as illustrated in FIG. 1F. In some embodiments, surfaces 512A of the electrical connectors 512 and surfaces 130A of the electrical connectors 130 are exposed, and are level with a surface 140A of the molding material 140. The electrical connectors 512 and 130 may be referred to as through molding vias (TMVs) and will be referred to as TMVs 512 and 130 hereinafter.

Figure 1G:
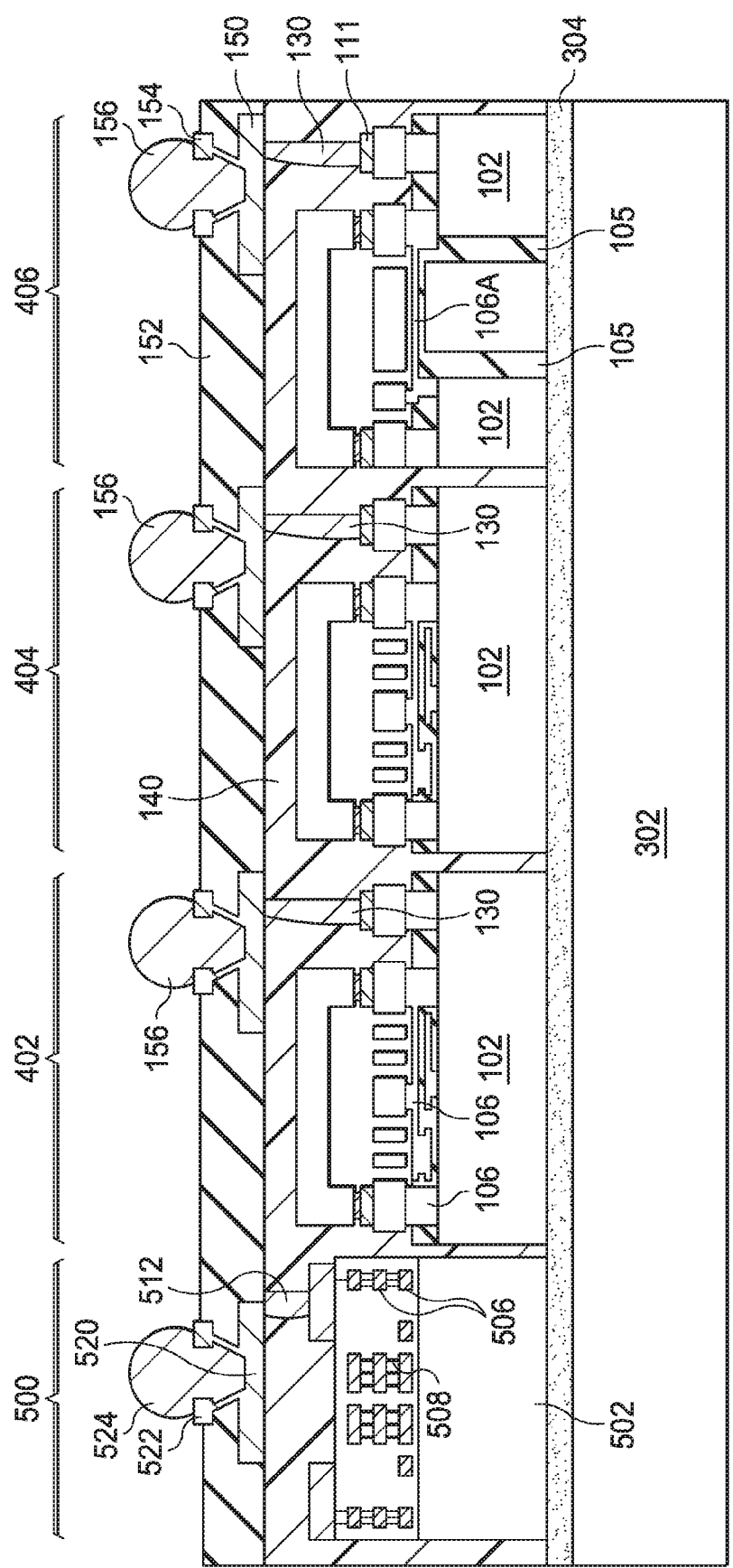

FIG. 1G illustrates forming the redistribution lines (RDLs) 520 and 150 over the dies and the formation of electrical connectors 524 and 156 over the RDLs. The RDL 520 is formed over and is electrically coupled to the TMV 512 and the RDLs 150 are formed over and are electrically coupled to the TMVs 130. The RDLs 520 and 150 may be copper, aluminum, tungsten, nickel, the like, or a combination thereof and may be formed using electroplating or other acceptable methods. Before plating the RDLs 520 and 150, a photo resist (not shown) may be may be formed by spin-on, lamination for a dry-film, or other acceptable methods. The photo resist may be patterned to expose the TMVs 512 and 130 and portions of the surface 140A of the molding material 140 using acceptable photolithography techniques or other acceptable methods.

The RDLs 520 and 150 may include a barrier layer and a seed layer (not shown). The barrier layer is a thin conformal film formed over the molding material 140. The barrier layer may be titanium nitride, tantalum nitride, tungsten nitride, titanium oxynitride, tantalum oxynitride, tungsten oxynitride, titanium, the like, or a combination thereof. The barrier layer may be deposited using methods such as CVD, PECVD, LPCVD, PVD, ALD, sputtering, or other acceptable methods. The seed layer is similarly a thin conformal layer formed over the barrier layer. The seed layer may be the material used to form the RDLs 520 and 150 such as copper, aluminum, tungsten, the like, or a combination thereof. The seed layer may be formed by PVD, ALD, CVD, or other acceptable methods.

After the RDLs 520 and 150 are formed, the photo resist is removed, for example, by stripping, and excess seed layer and barrier layer are removed, for example, by etching using the RDLs as a mask.

A dielectric layer 152 may be formed over the RDLs 520 and 150 and over the surface 140A of the molding material 140. The dielectric layer 152 may be an epoxy, a polyimide, polybenzoxazole (PBO), the like, or a combination thereof. The dielectric layer 152 may be formed using a spin-on technique or other deposition method. Openings (not shown) may be formed in the dielectric layer 152 to expose portions of the RDLs 520 and 150. The openings may be formed using acceptable photolithography techniques and etching.

After the openings are formed in the dielectric layer 152, under-bump metallizations (UBMs) may be formed in those openings. A UBM 522 may be formed over and electrically coupled to the RDL 520 and UBMs 154 may be formed over and electrically coupled to the RDLs 150.

The UBMs 522 and 154 may include one or more layers of conductive material. There are many arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 522 and 154. A photo resist (not shown) may be formed and patterned, so that some portions of the dielectric layer 152 are exposed, and some other portions are covered. A plating process may be performed to plate the materials and layers on the exposed portions of the dielectric layer 152 to form the UBMs 522 and 154. Any suitable materials or layers of material that may be used for the UBMs 522 and 154 are fully intended to be included within the scope of the current application. After the plating process, the photo resist may be removed. In some embodiments, the UBMs 522 and 154 may be contact pads 522 and 154.

FIG. 1G illustrates forming electrical connector 524 over and electrically coupled to the UBMs 522, and forming electrical connectors 156 over and electrically coupled to the UBMs 154. In an embodiment, the electrical connectors 524 and 156 are a ball grid array of solder balls and/or bumps, such as C4 bumps. In other embodiments, the electrical connectors 524 and 156 are metal pillars, wherein solder caps are formed on the top surfaces of the metal pillars. In yet other embodiments, the electrical connectors 524 and 156 are composite bumps comprising copper posts, nickel layers, solder caps, ENIG, ENEPIG, and/or the like. Although not shown in FIG. 1G, the RDL structures allow the electrical connectors 524 and 156 to be formed outside the lateral edge of their respective dies allowing for a fan-out of a ball grid array that may allow a greater area for the array compared to the active surfaces of the dies (see FIG. 2I).

Figure 1H:
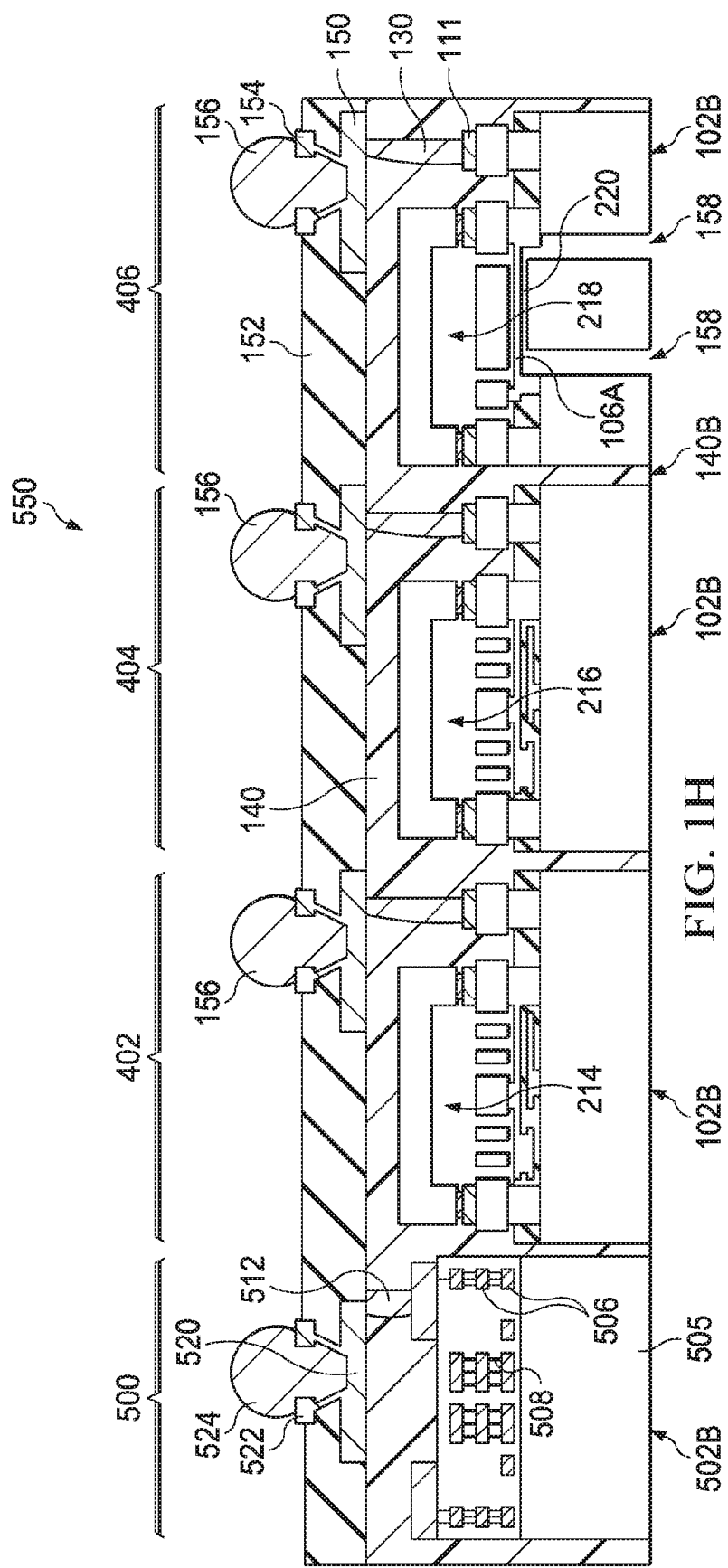

FIG. 1H illustrates removing the carrier 302 and the adhesive layer 304 to expose the backside 502B of the CMOS die 500 and the backsides 102B of the MEMS device dies 402, 404, and 406.

After the carrier 302 and the adhesive layer 304 are removed, the dielectric material 105 may be removed from the openings in the backside of the MEMS device die 406 to form openings 158. The openings 158 form a cavity 220 and expose the cavity 220 to ambient pressure adjacent a region 106A of the polysilicon layer 106 to form the pressure sensor device.

The reconfigured MEMS device die 550 formed in FIG. 1H includes a CMOS die 500 and three MEMS device dies 402, 404, and 406. Each of the three MEMS device dies 402, 404, and 406 have a sealed cavity (214, 216, and 218) and at least one of the three MEMS device dies 402, 404, and 406 have a cavity exposed to ambient pressure (220). The pressures of the sealed cavities 214, 216, and 218 can be substantially the same pressure or, because the sealed cavities are formed in separate dies, can have different pressures. In an embodiment, at least one of the sealed cavities 214 and 216 be a low pressure (high vacuum) cavity with a pressure in a range from about 0.1 mbar to about 500 mbar, with the other of the sealed cavities 214 and 216 being a high pressure cavity with a pressure in a range from about 2.5 ATM to about 3.5 ATM. The sealed cavities 214 and 216 can be formed from different wafers/processes and the pressure can different depending on the processes and/or the requirements for the MEMS device dies. In some embodiments, the cavity 218 can have a low pressure in a range from about 0.1 mbar to about 500 mbar and the cavity 220 can have a pressure of about 1 ATM. By singulating and testing the MEMS device dies 402, 404, and 406 and the CMOS die 500 before integrating them in to the MEMS device die 550, only known good dies are integrated into the MEMS device die 550, and thus, the yield for the MEMS device die 550 is improved. Further, by using TMVs rather than through substrate vias (TSVs), the cost of the MEMS device die 550 is further reduced.

FIGS. 2A through 2I illustrate cross-sectional views of intermediate stages of manufacture of a MEMS device die 650 in accordance with some embodiments. This embodiment is similar to the previous embodiment except that that the MEMS devices are not singulated into separate dies but integrated into a single die. Details regarding this embodiment that are similar to those for the previously described embodiment will not be repeated herein.

Figure 2A:
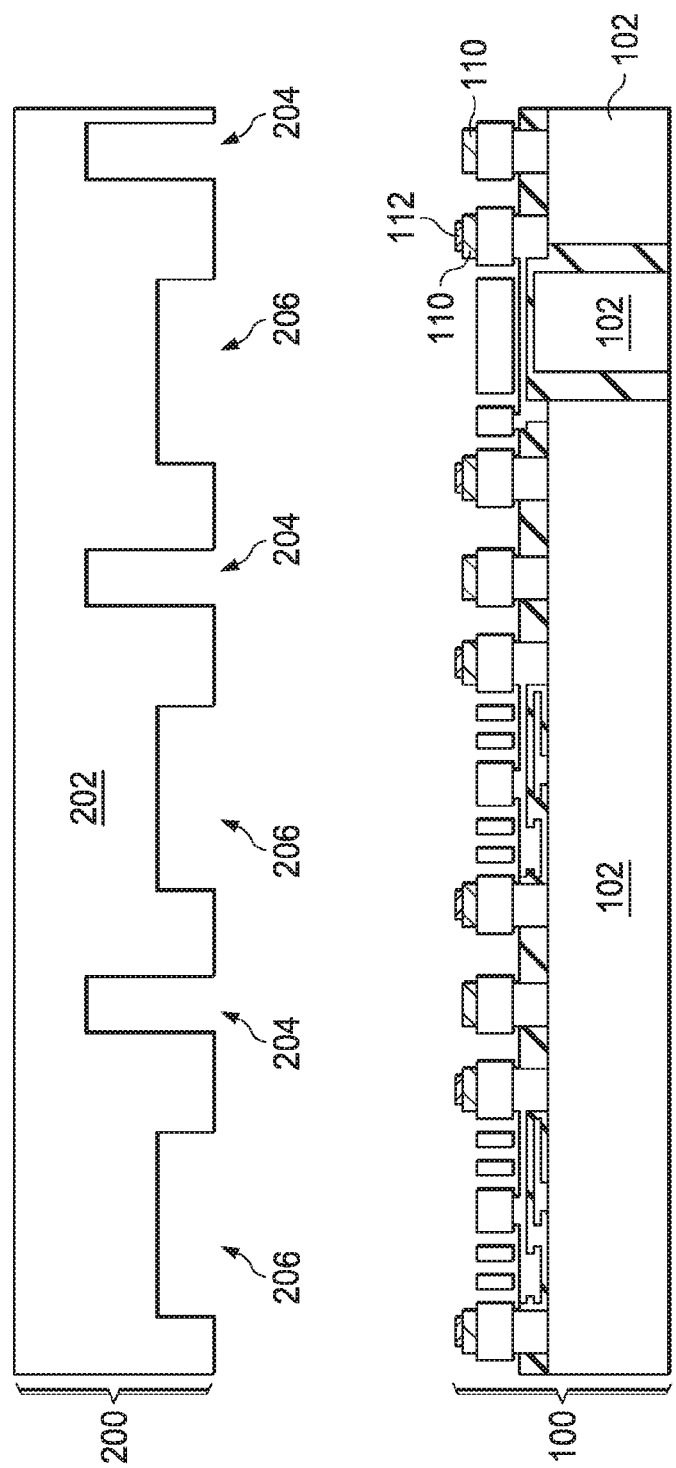
FIGS. 2A through 2I illustrate cross-sectional views of intermediate stages of manufacture of a MEMS device in accordance with some embodiments.

FIG. 2A illustrates a MEMS wafer 100 and a cap wafer 200. The structure in FIG. 2A is similar to the structure described above in FIG. 1A and the description is not repeated herein.

Figure 2B:
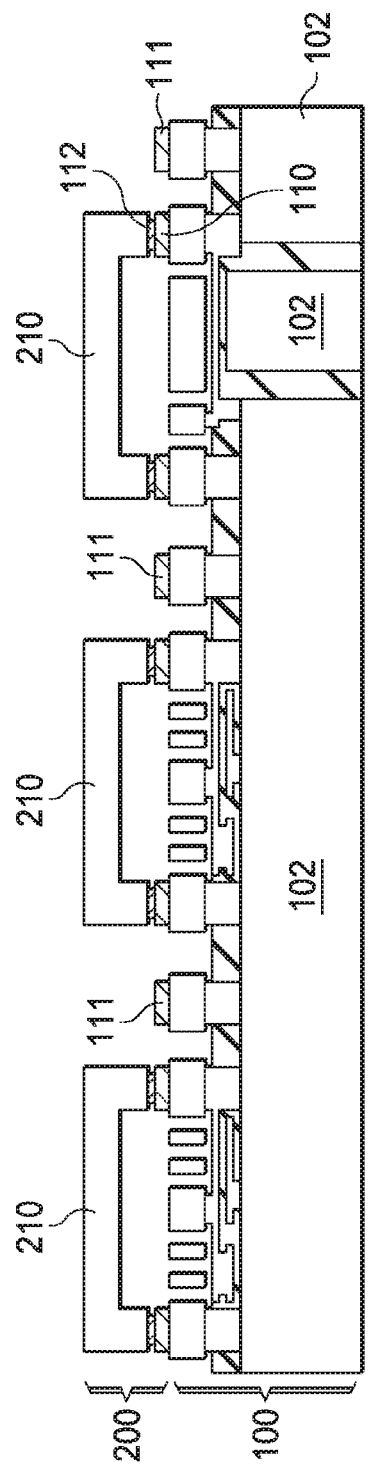

FIG. 2B illustrates the bonding of the cap wafer 200 to the MEMS wafer 100 and thinning the cap wafer 200. These steps may be similar to the steps described above in FIG. 1B and the descriptions are not repeated herein.

Figure 2C:
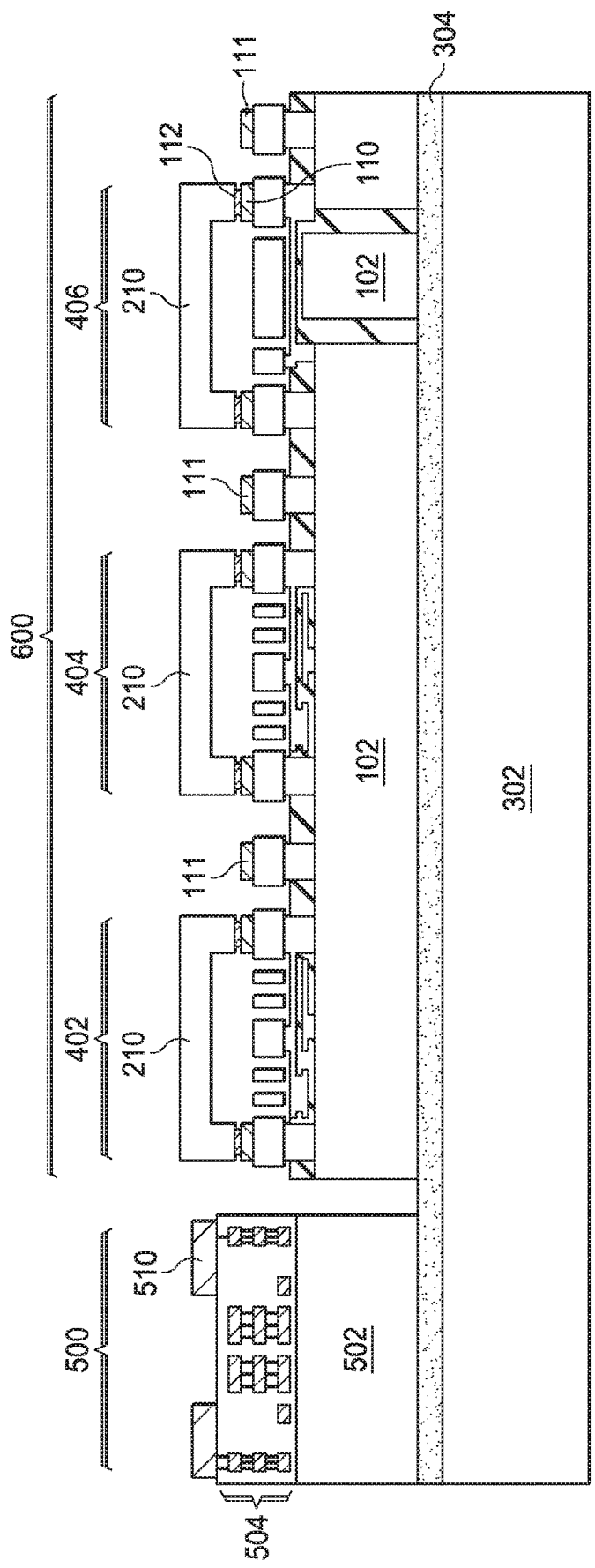

FIG. 2C illustrates attaching a MEMS device die 600 and a CMOS die 500 to a carrier 302 using the adhesive film 304. The MEMS device die 600 includes the three MEMS devices of the three MEMS device dies 402, 404, and 406 illustrated in FIG. 1C and their respective structures have been illustrated in FIG. 2C. The structure of FIG. 2C is similar to the structure of FIG. 1C except that the MEMS devices of the MEMS device die 600 in FIG. 2C have not been singulated, and thus, the description of the structure is not repeated herein.

Figure 2D:
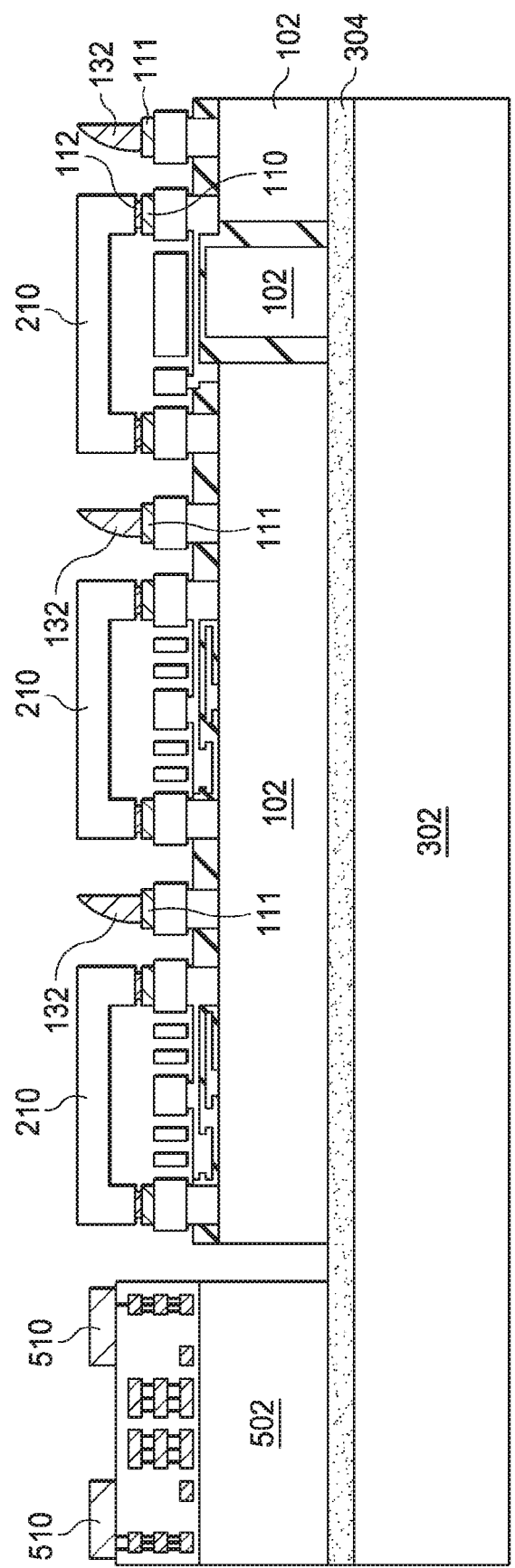

FIG. 2D illustrated the formation of electrical connectors 132 over and electrically coupled to the bond pads 111. The electrical connectors 132 are similar to the electrical connectors 130 in FIG. 1D and the description will not be repeated herein. In some embodiments, the electrical connectors 132 are formed to have a top surface below a top surface of the caps 210. In some embodiments, the bond pads 510 do not have electrical connectors formed over and electrically coupled to them, while, in other embodiments, electrical connectors are formed over and electrically coupled to the bond pads 510 (see FIG. 1D).

Figure 2E:
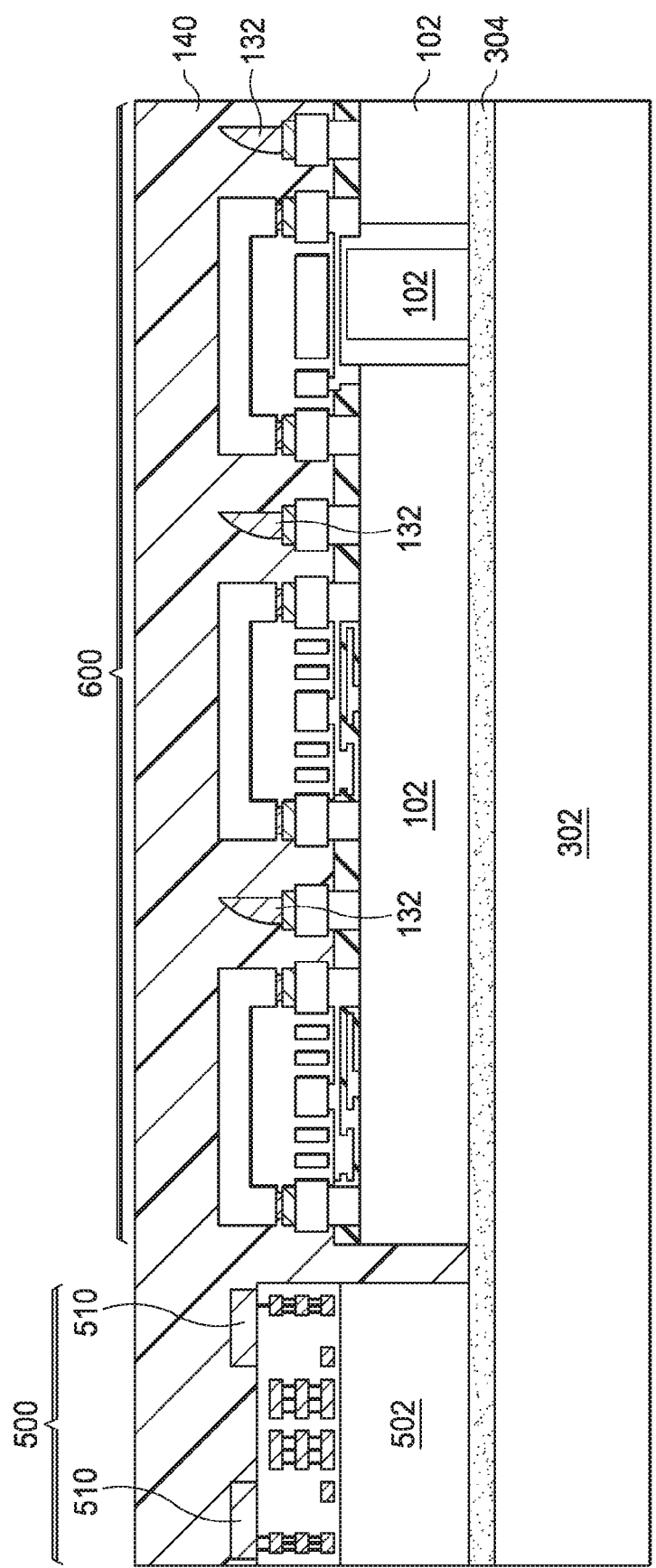

FIG. 2E illustrates encapsulating the CMOS die 500 and the MEMS device die 600 and the electrical connectors 132 with a molding material 140. The encapsulation process may be similar to the process described above in FIG. 1E and the description is not repeated herein.

Figure 2F:
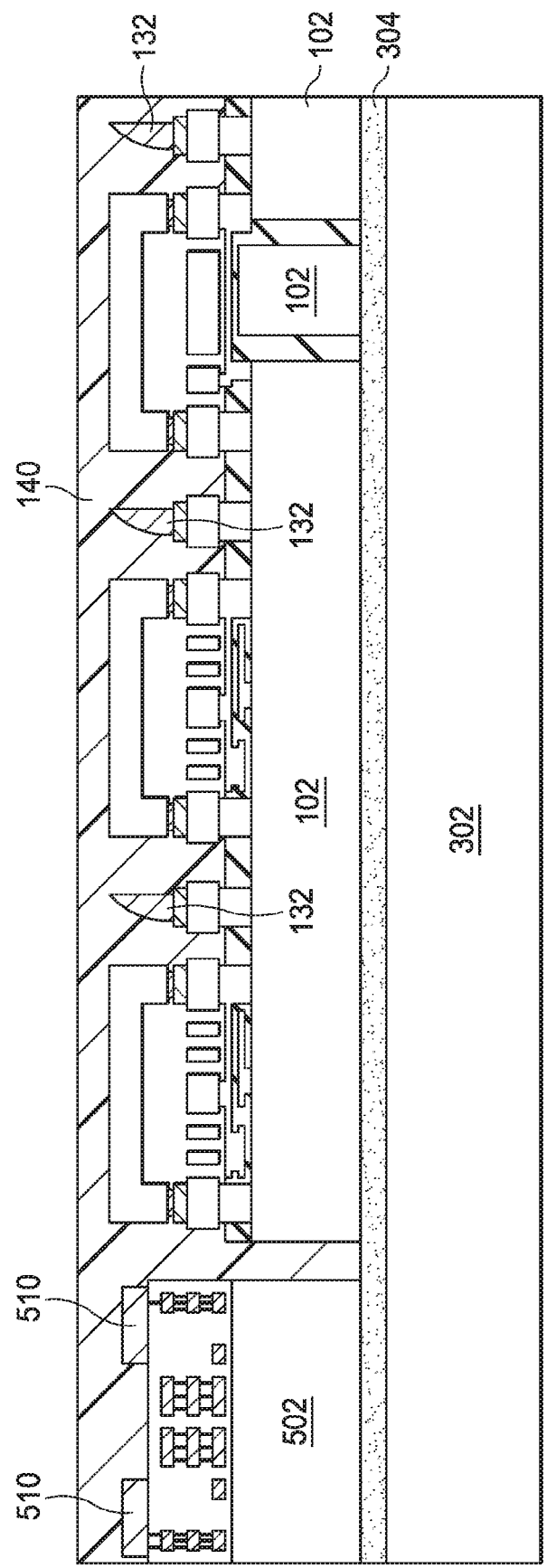

FIG. 2F illustrates thinning the molding material 140. The thinning process may be similar to the thinning process described above in FIG. 1F and the description is not repeated herein. However, in the illustrated embodiment, the thinning process does not expose the top surfaces of the electrical connectors 132 or the bond pads 510. In other embodiments, the top surfaces of the electrical connectors 132 and the bond pads 510 are exposed by the thinning of the molding material 140.

Figure 2G:
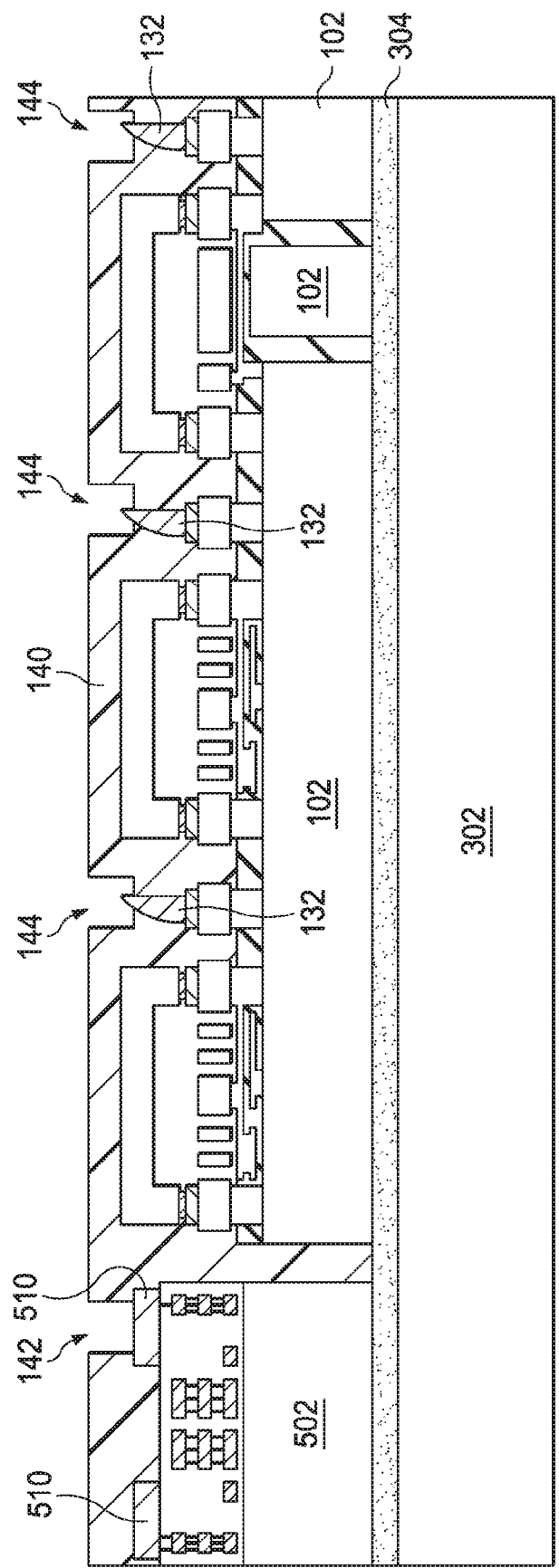

FIG. 2G illustrates patterning the molding material 140 to expose portions of the electrical connectors 132 and at least one bond pad 510. The bond pad(s) 510 may be exposed in opening(s) 142 and the electrical connectors 132 may be exposed in openings 144. The openings 142 and 144 may be formed using acceptable photolithography techniques and etching, such as a laser etching process.

Figure 2H:
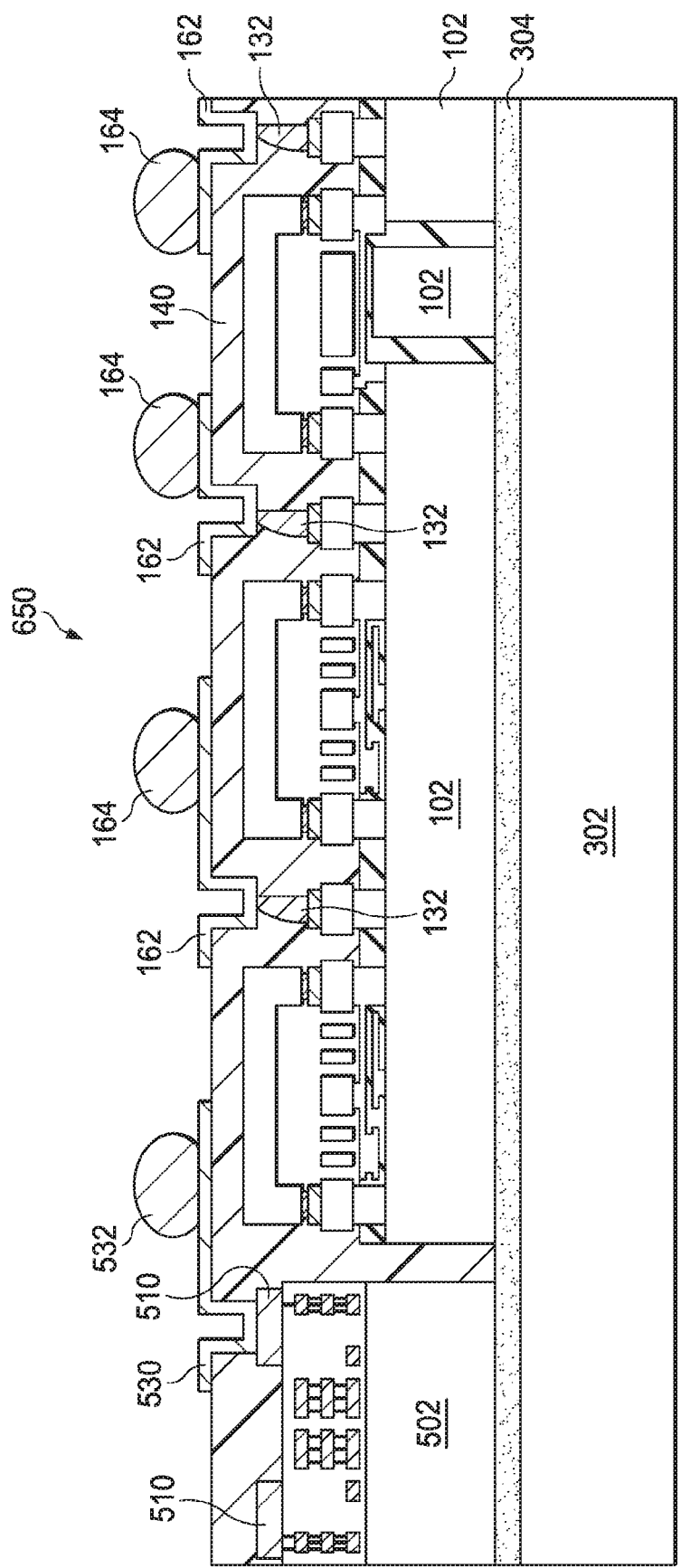

FIG. 2H illustrates forming the RDL 530 over and electrically coupled to the bond pad 510 and the RDLs 162 over and electrically coupled to the electrical connectors 132 with electrical connectors 532 and 164 formed on the RDLs 530 and 162, respectively. The RDLs 530 and 162 may be similar to the RDLs 150 described above in FIG. 1G and the description is not repeated herein. The electrical connectors 532 and 164 may be similar to the electrical connectors 524 and 156 described above in FIG. 1G and the description is not repeated herein. In some embodiments, the electrical connectors 532 and 164 are coupled directly to the RDLs 530 and 162, respectively, without using a UBM, and, in other embodiments, a UBM is included between the electrical connectors and RDLs.

Figure 2I:
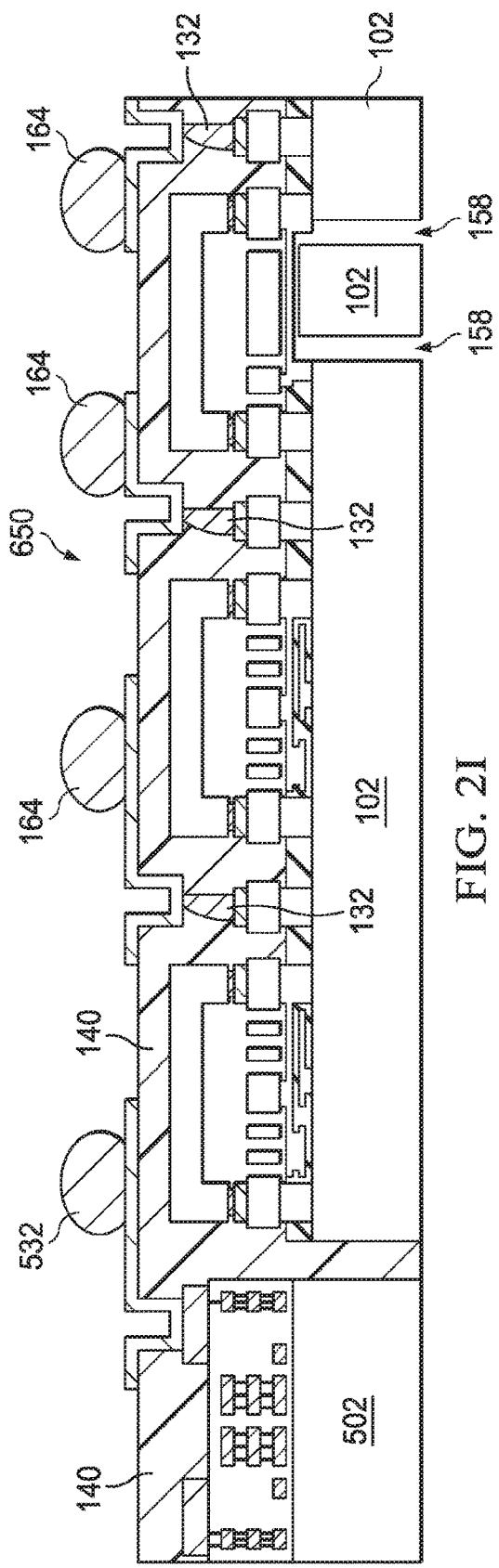

FIG. 2I illustrates removing the carrier 302 and the adhesive layer 304 to expose a backside of the CMOS die 500 and the MEMS device die 600 and forming the openings 158 in the backside of the MEMS device die 600. The structure and function of the reconfigured MEMS device die 650 in FIG. 2I may be similar to the structure and function of MEMS device die 550 in FIG. 1H and the description is not repeated herein. As illustrated in FIG. 2I, the RDL structures allow the electrical connectors 532 and 164 to be formed outside the lateral edge of their respective dies allowing for a fan-out of a ball grid array that may allow a greater area for the array compared to the active surfaces of the dies FIGS. 3A through 3F illustrate cross-sectional views of intermediate stages of manufacture of a MEMS device die 900 in accordance with some embodiments. Details regarding this embodiment that are similar to those for the previously described embodiments will not be repeated herein.

Figure 3A:
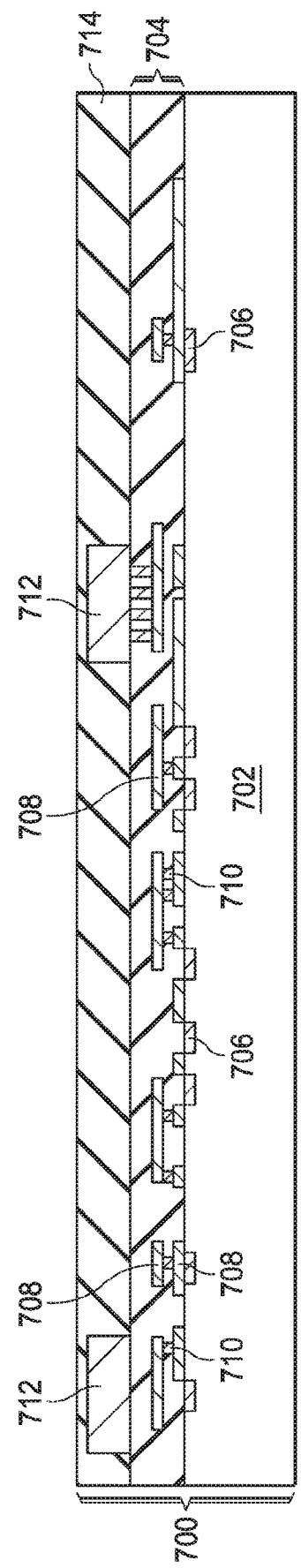
FIGS. 3A through 3F illustrate cross-sectional views of intermediate stages of manufacture of a MEMS device in accordance with some embodiments.

FIG. 3A illustrates a CMOS wafer 700 including a substrate 702, an interconnect structure 704, a dielectric layer 714, and bond pads 712. The substrate 702 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 702 may be a SOI substrate. Generally, an SOI substrate includes a layer of a semiconductor material such as epitaxial silicon, germanium, silicon germanium, SOI, SGOI, or combinations thereof.

The substrate 702 may include active and passive devices 706. As one of ordinary skill in the art will recognize, a wide variety of devices 706 such as transistors, capacitors, resistors, combinations of these, and the like may be used to generate the structural and functional requirements of the design for the MEMS device die 900. The devices 706 may be formed using any suitable methods.

The interconnect structure 704 is formed over the substrate 702. The interconnect structure 704 includes one or more metallization layers 708 which are interconnected by vias 710. The metallization layers 708 may be formed over the active and passive devices 706 and are designed to connect the various devices 706 to form functional circuitry. The metallization layers 708 may be formed of alternating layers of dielectric (e.g., low-k dielectric material) and conductive material (e.g., copper) and may be formed through any suitable process (such as deposition, damascene, dual damascene, or the like). Although FIG. 3A only illustrates two metallization layers 708, it is within the contemplated scope of the present disclosure that there may be more or less metallization layers 708 included in the interconnect structure 704.

The bond pads 712 may be formed over and in electrical contact with the interconnect structure 704 in order to help provide external connections to the active and passive devices 706. The bond pads 712 may be made of aluminum, an aluminum alloy, copper, a copper alloy, nickel, the like, or a combination thereof. The bond pads 712 may be formed using a deposition process, such as sputtering, to form a layer of material (not shown). Portions of the layer of material may then be removed through a suitable process, such as photolithographic masking and etching, to form the bond pads 712. However, any other suitable process may be utilized to form bond pads 712.

A dielectric layer 714 may be formed over the bond pads 712 and over the interconnect structure 704. The dielectric layer 714 may be an epoxy, a polyimide, PBO, the like, or a combination thereof. The dielectric layer 714 may be formed using a spin-on technique or other deposition method.

Figure 3B:
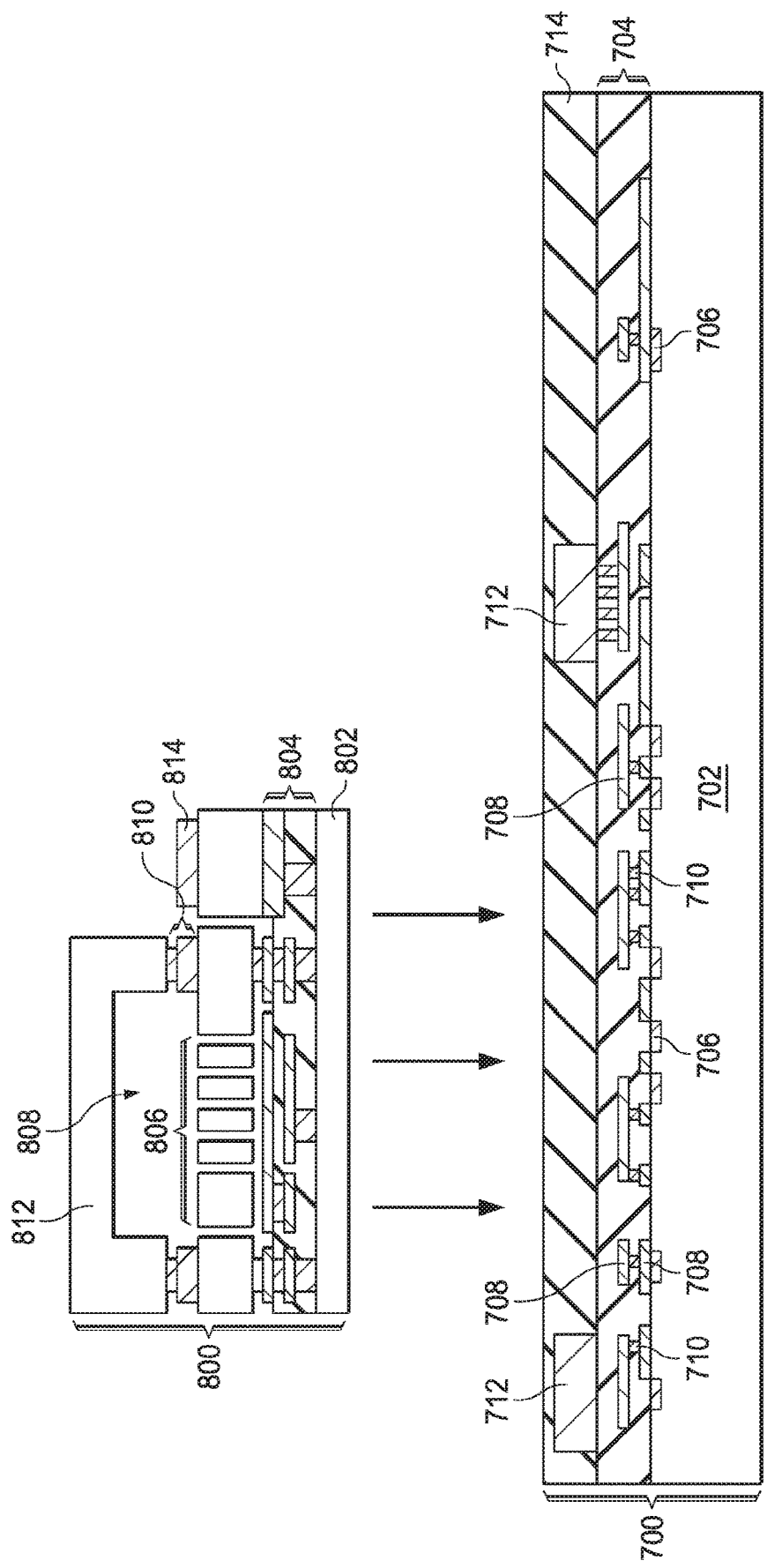

FIG. 3B illustrates attaching a MEMS device die 800 to dielectric layer 714 of the CMOS wafer 700. In an embodiment, the MEMS device die 800 is attached using an adhesive film (not shown) such as a glue film. The MEMS device die 800 may be similar to any one of the MEMS device dies 402, 404, and 406 described above and the descriptions will not be repeated herein.

The MEMS device die 800 includes a substrate 802, an interconnect structure 804 over the substrate 802, a cap 812 forming a cavity 808, a MEMS structure 806 surrounded by the cavity 808, bonding material layers 810 bonding the cap 812 to the MEMS structure wafer, and a bonding pad 814. In an embodiment, these structures of the MEMS device die 800 are similar to the respective structures of the MEMS device dies 402, 404, and 406. In some embodiments, the cap 812 is an ASIC die and may include active and passive devices. In some embodiments, the substrate 802 is an ASIC die and may include active and passive devices. In the embodiments wherein the cap 812 and/or the substrate 802 are ASIC dies, the size of the CMOS wafer 700 may be reduced because some of the active and passive devices, which were in the CMOS wafer 700, can be included in the cap 812 and/or the substrate 802. This can reduce the overall size and cost of the MEMS device.

Figure 3C:
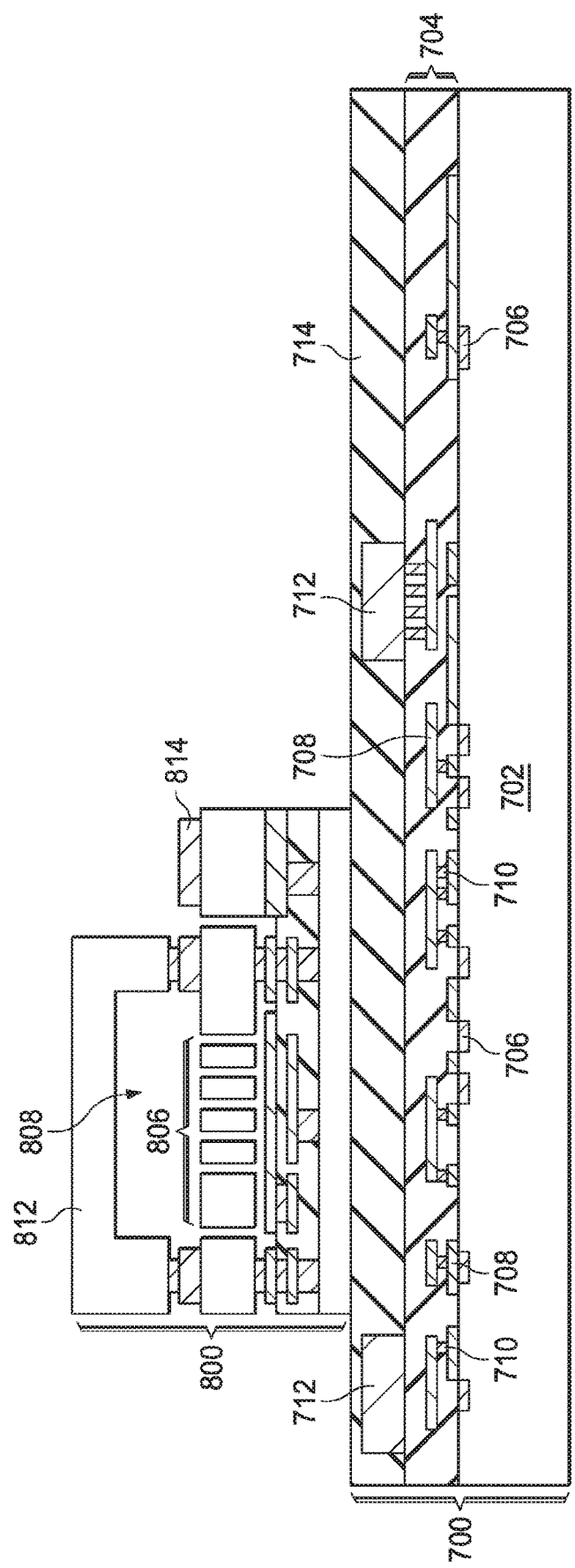
Figure 3D:
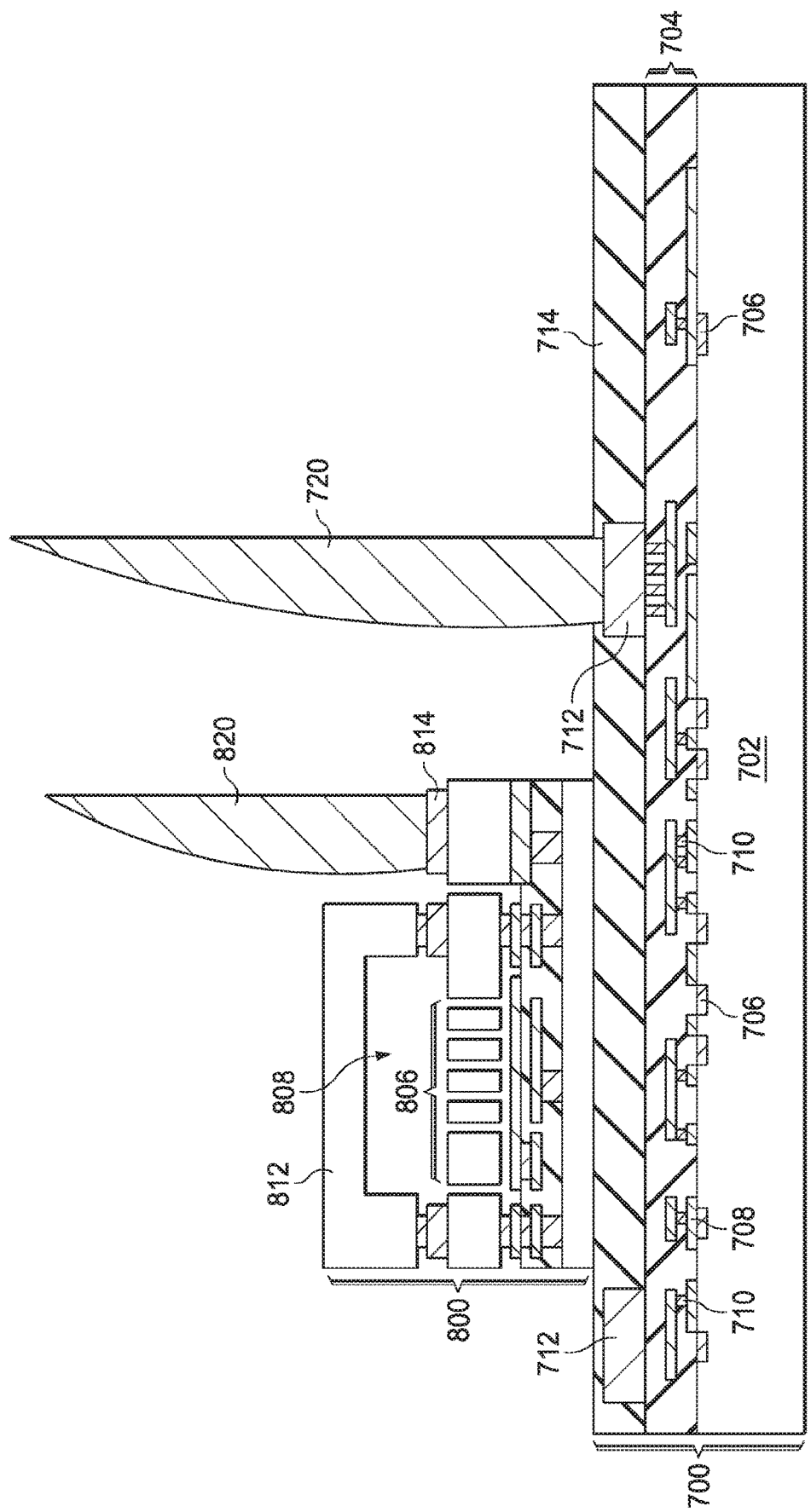

FIG. 3C illustrates the MEMS device die 800 after it has been attached to the CMOS wafer 700. FIG. 3D illustrates forming the electrical connectors 820 and 720 over and electrically coupled to the bond pads 814 and 712, respectively. The electrical connectors 820 and 720 may be similar to the electrical connectors 512 and 130 described above in FIG. 1D and the description is not repeated herein.

Figure 3E:
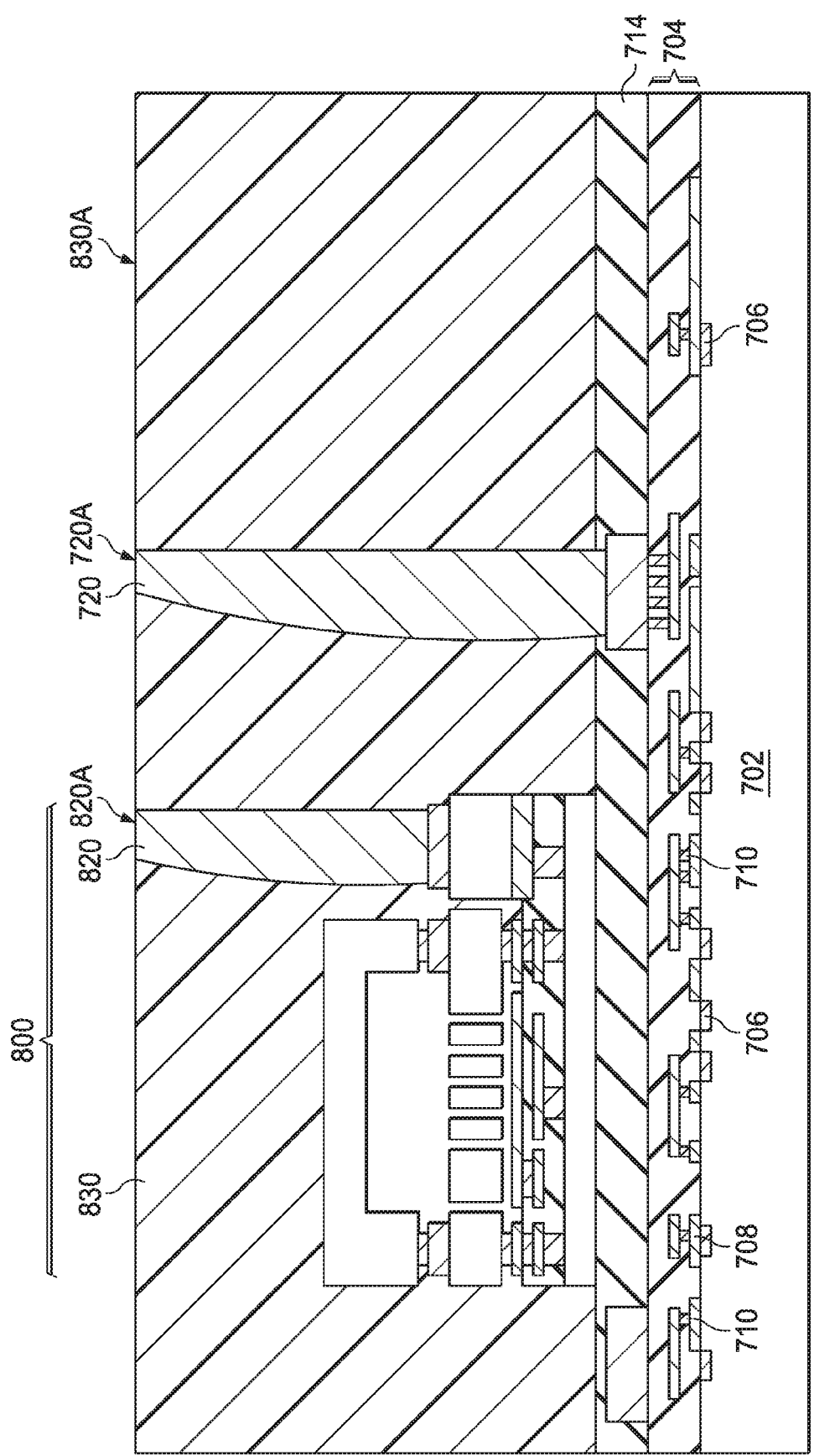

FIG. 3E illustrates encapsulating the MEMS device die 800 and the electrical connectors 820 and 720 in a molding material 830 and thinning the molding material 830. The encapsulation process may be similar to the encapsulation process described above in FIG. 1E and the description is not repeated herein. The thinning process may be similar to the thinning process described above in FIG. 1F and the description is not repeated herein. In some embodiments, the molding material 830 is thinned to have a surface 830A substantially coplanar with a surface 820A of the electrical connector 820 and a surface 720A of the electrical connector 720.

Figure 3F:
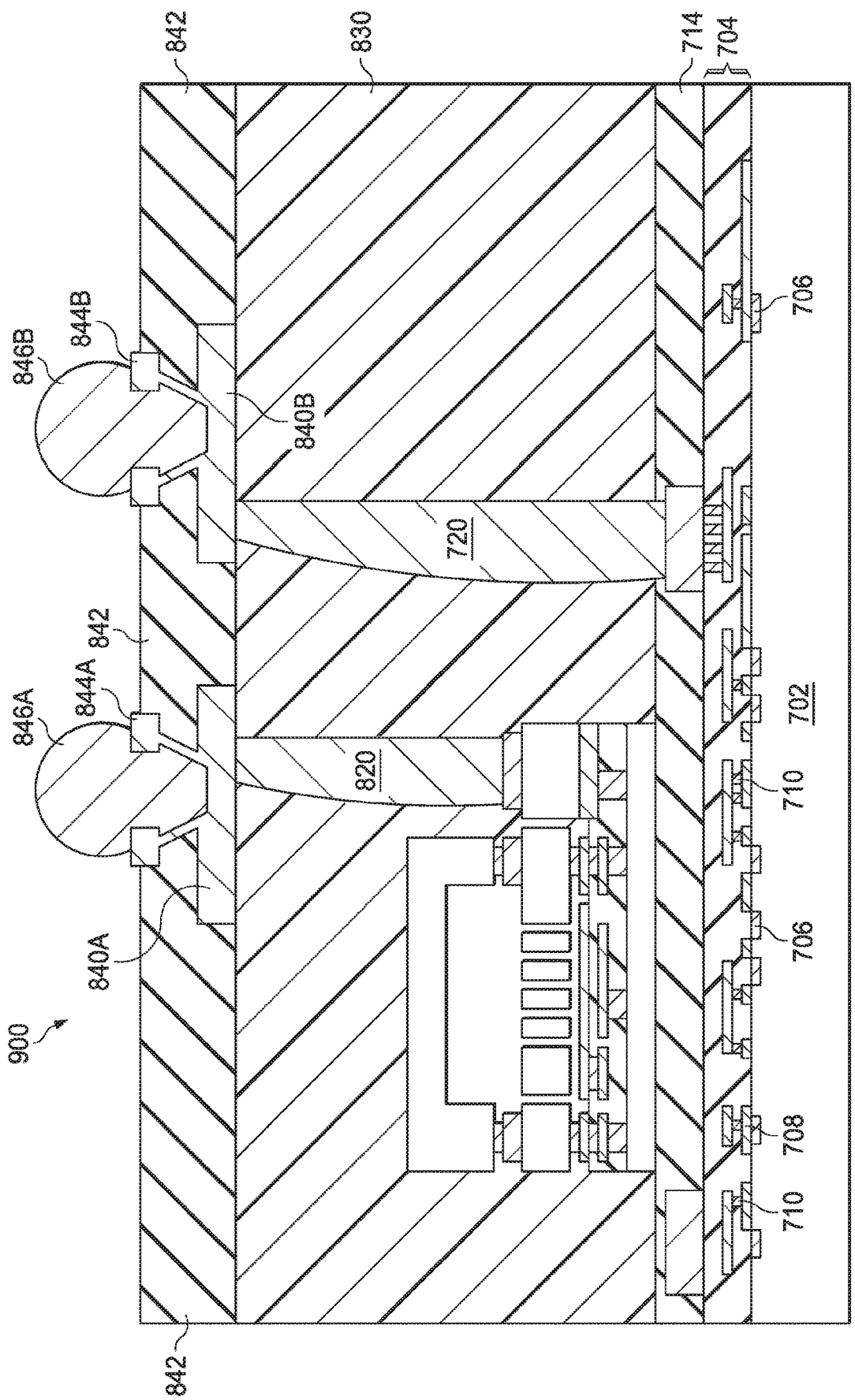

FIG. 3F illustrates forming the RDLs 840A and 840B, the dielectric layer 842, the UBMs 844A and 844B, and the electrical connectors 846A and 846B. The electrical connector 846A is electrically coupled to the electrical connector 720 via the UBM 844A and the RDL 840A. The electrical connector 846B is electrically coupled to the electrical connector 820 via the UBM 844B and the RDL 840B. These structures may be similar to their respective structures described above in FIG. 1G and the descriptions are not repeated herein. For example, the RDLs 840A and 840B may be similar to the RDLs 520 and 150 in FIG. 1G, the dielectric layer 842 may be similar to the dielectric layer 152 in FIG. 1G, the UBMs 844A and 844B may be similar to the UBMs 522 and 154 in FIG. 1G, and the electrical connectors 846A and 846B may be similar to the electrical connectors 524 and 156 in FIG. 1G. Further illustrated in FIG. 1G, the CMOS wafer 700 has been thinned by a backside thinning process such as a CMP process.

Figure 4:
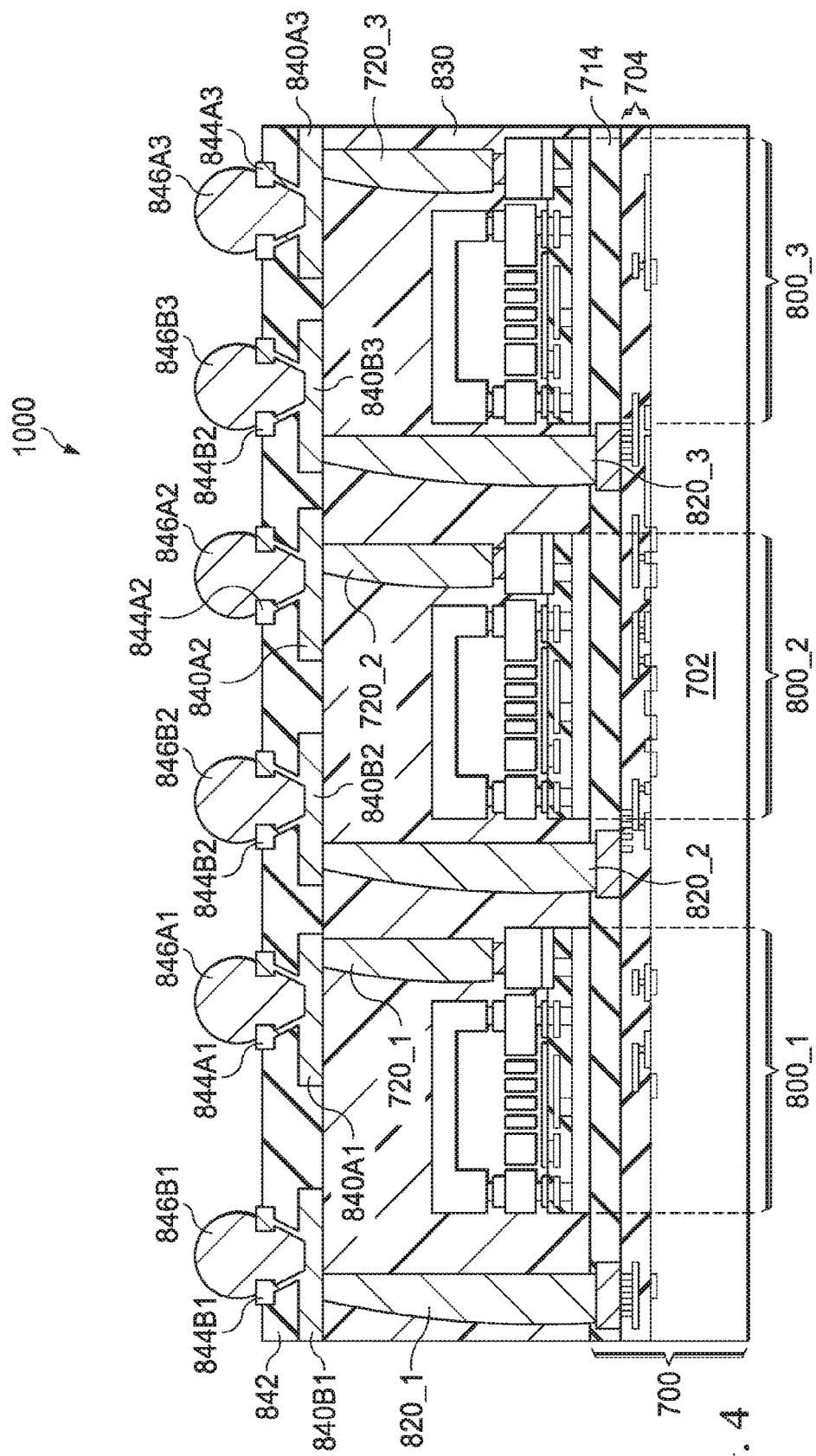
FIG. 4 illustrates a cross-sectional view of a MEMS device in accordance with some embodiments.

FIG. 4 illustrates a cross-sectional view of a MEMS device die 1000 in accordance with some embodiments. The MEMS device die 1000 is similar to the reconfigured MEMS device die 900 except that the reconfigured MEMS device die 1000 includes multiple MEMS device dies 800 (800_1, 800_2, and 800_3) on a CMOS wafer 700. Details regarding this embodiment that are similar to those for the previously described embodiments will not be repeated herein.

In this embodiment, each of the MEMS device dies 800 includes an electrical connector 720 (720_1, 720_2, and 720_3) and the CMOS wafer 700 has a corresponding electrical connector 820 (820_1, 820_2, and 820_3). Each of the electrical connectors 720 and 820 are coupled to electrical connectors 846A (846A1, 846A2, and 846A3) and 846B (846B1, 846B2, and 846B3), respectively.

By having the MEMS device dies formed separately and later integrated into a reconfigured die, the pressures of the sealed cavities of the various MEMS device dies can be substantially the same pressure or they can have different pressures. For example, one cavity can be at low pressure (high vacuum), one cavity can be at high pressure, and another cavity can be at ambient pressure. Further, by singulating and testing the MEMS device dies and the CMOS die before integrating them in to the reconfigured MEMS device die, only known good dies are integrated into the reconfigured MEMS device die, and thus, the yield for the reconfigured MEMS device die is improved. In addition, by using TMVs rather than through substrate vias (TSVs), the cost of the reconfigured MEMS device die is further reduced.

An embodiment is a method including forming a first a microelectromechanical system (MEMS) die having a first cavity, the first cavity having a first pressure, forming a second MEMS die having a second cavity, the second cavity having a second pressure, the second pressure being different from the first pressure, and encapsulating the first MEMS die and the second MEMS die with a molding material, the molding material having a first surface. The method further includes forming a first set of electrical connectors in the molding material, each of the first set of electrical connectors coupling at least one of the first and the second MEMS dies to the first surface of the molding material, and forming a second set of electrical connectors over the first surface of the molding material, each of the second set of electrical connectors being coupled to at least one of the first set of electrical connectors.

Another embodiment is a method including forming a MEMS wafer, the MEMS wafer having a first MEMS structure, a second MEMS structure, and a third MEMS structure, bonding a cap wafer to the MEMs wafer, the bonding forming a first cavity over the first MEMS structure, a second cavity over the second MEMS structure, and a third cavity over the third MEMS structure, and singulating the MEMS wafer forming a first MEMS die comprising the first MEMS structure and the first cavity, a second MEMS die comprising the second MEMS structure and the second cavity, and a third MEMS die comprising the third MEMS structure and the third cavity. The method further includes attaching the first MEMS die, the second MEMS die, and the third MEMS die to a carrier substrate, encapsulating the first MEMS die, the second MEMS die, and the third MEMS die with a molding material, the molding material extending from the carrier substrate over the first MEMS die, the second MEMS die, and the third MEMS die, and removing the carrier substrate.

A further embodiment is a microelectromechanical systems (MEMS) device comprising: a first MEMS die having a first cavity, the first cavity having a first pressure, a second MEMS die having a second cavity, the second cavity having a second pressure, the second pressure being different from the first pressure, and a molding material surrounding the first MEMS die and the second MEMS die, the molding material having a first surface over the first and the second MEMS dies. The MEMS device further includes a first set of electrical connectors in the molding material, each of the first set of electrical connectors coupling at least one of the first and the second MEMS dies to the first surface of the molding material, and a second set of electrical connectors over the first surface of the molding material, each of the second set of electrical connectors being coupled to at least one of the first set of electrical connectors.

A further embodiment is a microelectromechanical systems (MEMS) device. The MEMS device includes a first MEMS die having a first substrate and a first cavity, the first cavity having a first pressure. The MEMS device also includes a second MEMS die having a second substrate and a second cavity, the second cavity having a second pressure, the second pressure being different from the first pressure, the first substrate being physically separate from the second substrate. The MEMS device also includes a molding material surrounding the first MEMS die and the second MEMS die, the molding material having a first surface over the first MEMS die and the second MEMS die. The MEMS device also includes a second set of electrical connectors over the first surface of the molding material. The MEMS device also includes a first set of electrical connectors in the molding material, each of the first set of electrical connectors coupling at least one of the first MEMS die and the second MEMS die to one electrical connector of the second set of electrical connectors.

A further embodiment is a MEMS device. The MEMS device includes a complementary metal-oxide-semiconductor (CMOS) wafer, the CMOS wafer comprising an interconnect structure and a dielectric layer overlying the interconnect structure. The MEMS device also includes a first MEMS die over the dielectric layer, the first MEMS die having a first substrate and a first cavity, the first cavity having a first pressure. The MEMS device also includes a second MEMS die over the dielectric layer, the second MEMS die having a second substrate and a second cavity, the second cavity having a second pressure, the second pressure being different from the first pressure. The MEMS device also includes a molding material surrounding the first MEMS die and the second MEMS die, the molding material having a first surface over the first MEMS die and the second MEMS die. The MEMS device also includes a first set of electrical connectors in the molding material, each of the first set of electrical connectors coupling at least one of the first MEMS die and the second MEMS die to the first surface of the molding material.

A further embodiment is a MEMS device. The MEMS device includes a first MEMS die having a first cavity, the first cavity having a first pressure. The MEMS device also includes a second MEMS die having a second cavity, the second cavity having a second pressure, the second pressure being different from the first pressure, the first MEMS die and the second MEMS die overlying a first substrate. The MEMS device also includes a complementary metal-oxide-semiconductor (CMOS) die having a second substrate, the second substrate being physically separate from the first substrate. The MEMS device also includes a molding material surrounding the first MEMS die, the second MEMS die, and the CMOS die, the molding material having a first surface over the first MEMS die and the second MEMS die and the CMOS die. Molding material extends between the first substrate and the second substrate. The MEMS device also includes a first set of electrical connectors in the molding material, each of the first set of electrical connectors coupling at least one of the first MEMS die and the second MEMS die to the first surface of the molding material. The MEMS device also includes a second set of electrical connectors over the first surface of the molding material, each of the second set of electrical connectors being coupled to at least one of the first set of electrical connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical system (MEMS) device, comprising:
    a first MEMS device having a first cavity, the first cavity having a first pressure;
    a second MEMS device having a second cavity, the second cavity having a second pressure, the second pressure being different from the first pressure, the first MEMS device and the second MEMS device overlying a first substrate;
    a complementary metal-oxide-semiconductor (CMOS) die having a second substrate, the second substrate being physically separate from the first substrate;
    a molding material overlying the first MEMS device, the second MEMS device, and the CMOS die, wherein the molding material extends between the first substrate and the second substrate, and wherein a first surface of the molding material comprises a plurality of recessed regions;
    a first set of electrical connectors in the molding material, each of the first set of electrical connectors coupling at least one of the first MEMS device and the second MEMS device to a recessed region of the plurality of recessed regions; and
    a second set of electrical connectors over the first surface of the molding material, each of the second set of electrical connectors being coupled to at least one of the first set of electrical connectors.

2. The MEMS device of claim 1, wherein a first recessed region of the plurality of recessed regions is laterally disposed between the first MEMS device and the second MEMS device.

3. The MEMS device of claim 1, wherein a conductive material extends along sidewalls and a bottom surface of each of the plurality of recessed regions, and the conductive material extends along the first surface of the molding material.

4. The MEMS device of claim 3, wherein a first recessed region of the plurality of recessed regions is disposed over the CMOS die, wherein a conductive material extends along sidewalls of the first recessed region, and wherein the conductive material is electrically coupled to a bond pad over the CMOS die.

5. The MEMS device of claim 1, wherein the first MEMS device comprises a cap layer, and wherein an upper surface of the cap layer is further from the first substrate than an upper surface of one electrical connector of the first set of electrical connectors.

6. A microelectromechanical system (MEMS) device, comprising:
    a first substrate;
    a first MEMS device on the first substrate, the first MEMS device having a first cavity;
    a second MEMS device on the first substrate, the second MEMS device having a second cavity;
    a third MEMS device on the first substrate, the third MEMS device having a third cavity, wherein a pressure of the third cavity is different than a pressure of the first cavity and a pressure of the second cavity;
    a complementary metal-oxide-semiconductor (CMOS) die;
    a molding material extending between the CMOS die and the first MEMS device, between the first MEMS device and the second MEMS device, and between the second MEMS device and the third MEMS device, wherein a first surface of the molding material is farthest from the first substrate; and a first electrical connector extending between a second surface of the molding material and a first bond pad, wherein the second surface of the molding material is closer to the first substrate than the first surface of the molding material, and the first bond pad is physically coupled to the first substrate.

7. The MEMS device according to claim 6, wherein the first MEMS device comprises a first cap layer that partially defines the first cavity, the second MEMS device comprises a second cap layer that partially defines the second cavity, and the third MEMS device comprises a third cap layer that partially defines the third cavity.

8. The MEMS device according to claim 7, wherein a surface of the first cap layer that is farthest from the first substrate is further from the first substrate than the second surface of the molding material.

9. The MEMS device according to claim 6, wherein a membrane separates the third cavity from ambient air, and the membrane is exposed to the ambient air through an opening in the first substrate.

10. The MEMS device according to claim 6, wherein the first electrical connector is disposed between the second MEMS device and the third MEMS device.

11. The MEMS device according to claim 6, wherein a conductive material extends along the first surface of the molding material and the second surface of the molding material.

12. A device, comprising:
a plurality of microelectromechanical system (MEMS) devices formed on a first substrate, wherein each of the plurality of MEMS devices comprises a respective cavity of a plurality of cavities, and wherein a respective first surface of each of the plurality of MEMS devices is a surface of the respective MEMS device that is farthest from the first substrate;
a molding material overlying the plurality of MEMS devices;
a plurality of first electrical connectors disposed over the first substrate, wherein each electrical connector of the plurality of first electrical connectors separates two adjacent MEMS devices of the plurality of MEMS devices; and
a plurality of second electrical connectors overlying the plurality of first electrical connectors, wherein the plurality of first electrical connectors is electrically coupled to the plurality of second electrical connectors, wherein each of the plurality of second electrical connectors has a respective first surface that is a surface of the respective second electrical connector that is closest to the first substrate, the respective first surface of each respective second electrical connector is disposed on a first surface of the molding material, and wherein the respective first surface of each of the plurality of second electrical connectors is closer to the first substrate than the respective first surface of each of the plurality of MEMS devices.

13. The device according to claim 12, wherein a first cavity of the plurality of cavities has a first pressure, a second cavity of the plurality of cavities has a second pressure, and the first pressure and the second pressure are different.

14. The device according to claim 12, further comprising:
a complementary metal-oxide-semiconductor (CMOS) die comprising a second substrate, the CMOS die being disposed beside the plurality of MEMS devices.

15. The device according to claim 14, wherein the molding material extends between the first substrate and the second substrate.

16. The device according to claim 12, wherein the first surface of the molding material is a surface of the molding material that is farthest from the first substrate, and the first surface of the molding material comprises a plurality of recessed regions.

17. The device according to claim 16, wherein a respective second electrical connector of the plurality of second electrical connectors extends in each of the plurality of recessed regions.

18. The device according to claim 17, wherein a plurality of third electrical connectors are disposed on and physically connected to the plurality of second electrical connectors.

19. The device according to claim 17, wherein a first second electrical connector of the plurality of second electrical connectors is disposed in a first recessed region of the plurality of recessed regions, and the first second electrical connector lines but does not fill the first recessed region of the plurality of recessed regions.

20. The device according to claim 12, wherein the first surface of the molding material is a surface of the molding material that is farthest from the first substrate.

* * * * *